United States Patent
Huang et al.

(10) Patent No.: US 12,393,609 B2
(45) Date of Patent: Aug. 19, 2025

(54) DATABASE DATA COMPRESSION METHOD AND STORAGE DEVICE

(71) Applicant: HUAWEI TECHNOLOGIES CO., LTD., Guangdong (CN)

(72) Inventors: Yongbing Huang, Beijing (CN); Chengda Wu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/645,926

(22) Filed: Apr. 25, 2024

(65) Prior Publication Data

US 2024/0273121 A1 Aug. 15, 2024

Related U.S. Application Data

(63) Continuation of application No. PCT/CN2021/126976, filed on Oct. 28, 2021.

(51) Int. Cl.
*G06F 7/00* (2006.01)
*G06F 16/25* (2019.01)
*G06F 16/28* (2019.01)

(52) U.S. Cl.
CPC ......... *G06F 16/285* (2019.01); *G06F 16/258* (2019.01)

(58) Field of Classification Search
CPC ............................ G06F 16/285; G06F 16/258
USPC .................................................. 707/600–899
See application file for complete search history.

(56) References Cited

U.S. PATENT DOCUMENTS

| | | |
|---|---|---|
| 6,573,890 B1 | 6/2003 | Lengyel |
| 2009/0006399 A1 | 1/2009 | Raman et al. |
| 2017/0309143 A1* | 10/2017 | Trani ............... G06F 16/7864 |

FOREIGN PATENT DOCUMENTS

WO 2019028269 A2 2/2019

OTHER PUBLICATIONS

Ahmed Elgohary et al:"Compressed linear algebra for large-scale machine learning." Sep. 12, 2017. total 26 pages.

* cited by examiner

*Primary Examiner* — Isaac M Woo
(74) *Attorney, Agent, or Firm* — WOMBLE BOND DICKINSON (US) LLP

(57) ABSTRACT

This application discloses a database data compression method and a storage device, which are applicable to lossless compression of a relational database. The method includes parsing a first data block to obtain m pieces of first data, where the first data is row/column data, and the first data block is obtained based on database data. Then, the method includes classifying the m pieces of first data according to a machine learning algorithm or a deep learning algorithm, to obtain n classification categories, and transforming first data in each classification category to obtain target data. The method further includes compressing the target data to obtain compressed data. In this application, data in different rows/columns is classified according to the machine/deep learning algorithm, and then the row/column data belonging to the same classification category is transformed and compressed.

18 Claims, 10 Drawing Sheets

Data: c a a c a b c a b a a

⇩

LZ77 algorithm: Replace a duplicate character string with a short tag c a a c a b c a b a a Replace "cab" with <3, 3, a> c a <1, 1, c> <3, 2, b> <3, 3, a> <8, 2,>

⇩

Entropy coding: For example, Huffman coding or asymmetric numeral systems ANS

FIG. 1

```
age salary credit sex
20, 15000, 10,  0, ...
21, 15000, 90,  0, ...
30, 30000, 50,  1, ...
31, 30000, 11,  1, ...
40, 50000, 10,  0, ...
41, 50000, 80,  0, ...
```

FIG. 2

Input data → [Prediction/Transformation module] —Probability→ [Coding algorithm] —Information→ Output data (Symbol)

FIG. 3

DATABASE DATA COMPRESSION METHOD AND STORAGE DEVICE

CROSS-REFERENCE TO RELATED APPLICATIONS

This application is a continuation of International Application No. PCT/CN2021/126976, filed on Oct. 28, 2021, the disclosure of which is hereby incorporated by reference in its entirety.

TECHNICAL FIELD

This application relates to the data compression field, and in particular, to a database data compression method and a storage device.

BACKGROUND

Data compression is a process of converting data in an original format into data in a more compact format to save storage space. Data compression may be classified into lossy data compression and lossless data compression. The lossy data compression is usually used for image compression. The lossless data compression is usually used for file compression. The lossless data compression is a technical method for optimizing a data storage mode of files, that is, reducing a data amount of original data without losing useful information to save storage space and improve transmission, storage, and processing efficiency.

A basic idea of a data compression algorithm is to replace a duplicate character in data with a shorter coding symbol. A higher existence probability of a character indicates a shorter coding symbol. In an existing manner, a general data compression algorithm, for example, an open-source Zstandard (ZSTD) algorithm of Facebook, can provide a high compression ratio for to-be-compressed data. The ZSTD algorithm mainly includes two parts: an LZ77 algorithm and an entropy coding algorithm. The LZ77 algorithm is mainly used to transform data and replace a duplicate character string with a shorter tag. As shown in FIG. 1, a character string "cab" that exists for a second time is replaced with <an offset of a previous duplicate character string, a length of a replaced character string, and a next character>, namely, a triplet <3, 3, a>. The LZ77 algorithm can be used to effectively eliminate redundancy in data with a large quantity of duplicate strings and long duplicate character strings, such as a text. Data processed according to the LZ77 algorithm is further compressed according to the entropy coding algorithm.

However, database data, such as financial data and transaction data, is mainly floating-point numbers or integer data instead of characters such as a text. Consequently, there are few duplicate character strings in the database data, and processing efficiency of the LZ77 algorithm is low.

SUMMARY

Embodiments of this application provide a database data compression method and a storage device, to obtain, for database data (the database data is mainly structured data in a normalized format and is usually stored in a row-column form), an association relationship between data in different rows or data in different columns in the database data according to a machine learning algorithm (for example, a clustering algorithm) or a deep learning algorithm, classify the data in different rows or the data in different columns based on the association relationship, and transform and compress row data or column data belonging to a same classification category. Because a proportion of a duplicate character in the row data or column data belonging to the same classification category is increased, a compression ratio of the database data can be improved after an entropy coding algorithm is used.

Based on this, embodiments of this application provide the following technical solutions.

According to a first aspect, an embodiment of this application first provides a database data compression method, which may be used in the data compression field. The method includes: first parsing a first data block to obtain m pieces of first data, where m>1, the first data may be row data or column data, and the first data block is obtained based on obtained database data. After the m pieces of first data are obtained, the m pieces of first data may be further classified. For example, the m pieces of first data may be classified according to a target algorithm (for example, a machine learning algorithm or a deep learning algorithm), to obtain n classification categories, where n≥1. Each classification category includes at least one piece of first data. It should be noted that an objective of classifying the m pieces of first data is to recognize an association between data in different rows or data in different columns, and classify row data or column data with a large association together. For example, some data may be extracted from each row or each column to constitute a feature of the row or the column, and then the row data or the column data is classified according to the machine learning algorithm (for example, a clustering algorithm). Row data or column data in a same classification category can be considered as data with a large association. The classification process may also be referred to as a process of predicting semantics of the database data. First-layer semantics is predicted: recognizing an association between row data or column data. After the n classification categories are obtained, row data or column data in each (namely, the first classification category) of the n classification categories is transformed, to obtain target data. Then, the target data is compressed, to obtain compressed data. For example, the target data may be compressed according to an entropy coding algorithm like arithmetic coding, Huffman coding, or asymmetric numerical systems (asymmetric numeral systems, ANS), to obtain the compressed data.

In the foregoing embodiment of this application, for the database data, data in different rows/columns is classified, row/column data belonging to a same classification category is considered to be strongly associated with each other, and then the row data or column data belonging to the same classification category is transformed and compressed. Because a proportion of a duplicate character in the row data or column data belonging to the same classification category is increased, a compression ratio of the database data can be improved.

In a possible embodiment of the first aspect, there are a plurality of manners of performing a transformation operation on the first data in the first classification category. Specifically, a manner of performing the transformation operation on the first data in the first classification category may be: when there are a plurality of pieces of first data in the first classification category, concatenating the first data in the first classification category, where concatenated data constitutes the target data. In other words, the performed transformation operation is directly concatenating all first data in the first classification category, where the concatenated data constitutes the to-be-compressed target data. Because to-be-concatenated data is associated with each other (in other words, all to-be-concatenated data belongs to a same classification category), the concatenated data may have a large amount of redundancy, which is easy to be recognized by a compression algorithm.

In the foregoing embodiment of this application, a reason for concatenating the first data in the first classification category to constitute the target data is as follows: Because first data in a same classification category belongs to the same classification category (that is, a large association, and a larger association indicates more similar data), it indicates that proportions and/or a quantity of duplicate characters included in different first data in the same classification category are increased compared with those before classification. In this way, a compression ratio of the database data can also be improved based on only a first-layer semantic prediction result of the database data (that is, recognizing the association between row data or column data).

In a possible embodiment of the first aspect, a manner of performing the transformation operation on the first data in the first classification category may alternatively be: when there are a plurality of pieces of first data in the first classification category, selecting at least one piece of first data from the first classification category as reference data; predicting, based on the selected at least one piece of reference data, other first data (which may be referred to as non-reference data) that is in the first classification category and that is not the reference data, to obtain predicted data, for example, predicting at least one piece of non-reference data in the first classification category based on the selected at least one piece of reference data, to obtain at least one piece of predicted data, where one piece of non-reference data corresponds to one piece of predicted data; and finally obtaining the final target data based on the at least one piece of non-reference data and the obtained at least one piece of predicted data. In this embodiment of this application, a process of recognizing a transformation relationship between the first data in the first classification category may be referred to as another process of predicting semantics of the database data. Second-layer semantics is predicted: recognizing a transformation relationship between row data or column data.

In the foregoing embodiment of this application, based on the predicted first-layer semantics (that is, recognizing the association between row data or column data), the second-layer semantics (that is, recognizing the transformation relationship between row data or column data) is further predicted, to obtain the predicted data. Then, data transformation is performed on original data based on the predicted data, so that complex original data is transformed into simplified data with a high duplicate rate. This further improves a compression ratio of subsequent data compression.

In a possible embodiment of the first aspect, a process of predicting at least one piece of non-reference data in the first classification category based on the selected at least one piece of reference data, to obtain at least one piece of predicted data may specifically be: first predicting an association relationship between the reference data and the at least one piece of non-reference data in the first classification category, and then further predicting the at least one piece of non-reference data based on the reference data and the association relationship, to obtain the at least one piece of predicted data. For example, the association relationship between the reference data and the at least one piece of non-reference data in the first classification category may be predicted, to obtain a transformation formula. Then, the at least one piece of non-reference data is predicted based on the reference data and the transformation formula, to obtain the at least one piece of predicted data. In other words, a transformation relationship between reference data and non-reference data is reflected by the transformation formula. According to the transformation formula, the at least one piece of predicted data corresponding to the at least one piece of non-reference data may be obtained based on the reference data.

In the foregoing embodiment of this application, a manner of first predicting the association relationship, and then obtaining the predicted data based on the association relationship is specifically described. The manner is feasible.

In a possible embodiment of the first aspect, a process of predicting the association relationship between the reference data and the at least one piece of non-reference data in the first classification category may specifically be: predicting the association relationship between the reference data and the non-reference data in the first classification category by using a linear regression equation. In some other embodiments of this application, the association relationship between the reference data and the non-reference data in the first classification category may alternatively be predicted by using a non-linear model (for example, a quadratic model). This is not specifically limited in this application.

In the foregoing embodiment of this application, that the association relationship between the reference data and the non-reference data in the first classification category may be predicted in various manners is specifically described. The manners are flexible.

In a possible embodiment of the first aspect, a manner of obtaining the target data based on the at least one piece of non-reference data and the at least one piece of predicted data may be: after obtaining the at least one piece of predicted data corresponding to the at least one piece of non-reference data, further determining at least one piece of transformation data based on a difference between the at least one piece of non-reference data and the corresponding at least one piece of predicted data. For example, the difference between the at least one piece of non-reference data and the corresponding at least one piece of predicted data may be used as the at least one piece of transformation data, or a product of a preset coefficient and the difference between the at least one piece of non-reference data and the corresponding at least one piece of predicted data may be used as the at least one piece of transformation data. This is not specifically limited herein. One piece of transformation data corresponds to one piece of non-reference data. For example, it is assumed that there are three pieces of non-reference data (it is assumed that each piece of non-reference data is denoted as Y) in total in a specific classification category. After the foregoing transformation operation is performed, each piece of non-reference data corresponds to one piece of predicted data, and there are three pieces of predicted data in total (it is assumed that each piece of predicted data is denoted as Y'). In this case, $Y''=Y-Y'$ or $Y''=p \times (Y-Y')$. Herein, p is the preset coefficient, and Y" is the transformation data. Each piece of non-reference data has a corresponding transformation data. After the transformation data corresponding to each piece of non-reference data is obtained, the transformation data may be directly used as the target data, where one piece of transformation data corresponds to one piece of target data. If there are at least two pieces of transformation data, the at least two pieces of transformation data may alternatively be concatenated, to obtain the target data. This is not specifically limited in this application.

In the foregoing embodiment of this application, the manner of obtaining the target data based on the at least one piece of non-reference data and the corresponding at least one piece of predicted data is specifically described. There are various manners of determining the target data, and the manners are flexible and widely applicable.

In a possible embodiment of the first aspect, another manner of obtaining the target data based on the at least one piece of non-reference data and the at least one piece of predicted data may be: after obtaining the at least one piece of predicted data corresponding to the at least one piece of non-reference data, further determining at least one piece of transformation data based on a difference between the at least one piece of non-reference data and the corresponding at least one piece of predicted data. For example, the difference between the at least one piece of non-reference data and the corresponding at least one piece of predicted data may be used as the at least one piece of transformation data, or a product of a preset coefficient and the difference between the at least one piece of non-reference data and the corresponding at least one piece of predicted data may be used as the at least one piece of transformation data. This is not specifically limited herein. One piece of transformation data corresponds to one piece of non-reference data. Then, a redundant data cleanup operation, for example, operations such as data splitting and data compaction, is performed on the at least one piece of transformation data, to obtain at least one piece of cleaned transformation data. For example, for transformed database data of a numeric type like a floating point or an integer, a single piece of data may include four or eight bytes, and most-significant data may have a large amount of redundancy 0. Data splitting is mainly splitting performed on long-byte data by byte. Bytes in a same position (for example, each byte is a first byte) are continuously stored. Data compaction is mainly elimination of redundancy 0 in most-significant data. For example, if first two bytes of all data are 0, the two bytes are directly eliminated. In the operation, a data cleanup manner needs to be recorded. If a data splitting operation is performed, information such as a quantity of split bytes is recorded; or if a data compaction operation is performed, a length of the eliminated data 0 is recorded. After obtaining the cleaned transformation data, a storage device may directly use the cleaned transformation data as the target data, where one piece of cleaned transformation data corresponds to one piece of target data. If there are at least two pieces of cleaned transformation data, the storage device may alternatively concatenate the at least two pieces of cleaned transformation data to obtain the target data. This is not specifically limited in this application. It should also be noted that, in this embodiment of this application, a manner of concatenating the cleaned transformation data is similar to the foregoing manner of concatenating the first data belonging to the same classification category. For details, refer to the foregoing description. Details are not described herein again.

In the foregoing embodiment of this application, to further eliminate data redundancy, after the at least one piece of transformation data is obtained, the redundant data cleanup operation, for example, operations such as data splitting and data compaction, may be further performed on the at least one piece of transformation data, to obtain the at least one piece of cleaned transformation data. The at least one piece of cleaned transformation data has fewer characters and a character with a higher duplicate rate, so that a compression ratio of subsequent data compression is further improved.

In a possible embodiment of the first aspect, a specific embodiment of classifying the m pieces of first data to obtain n classification categories may be: first selecting a preset quantity of characters from each of the m pieces of first data to construct m eigenvectors, where one eigenvector corresponds to one piece of first data. For example, it is assumed that the first data block includes 20 pieces of column data (namely, m=20, and it is assumed that the first data is column data), and each piece of column data includes 50 characters. In this case, the storage device may select the preset quantity of characters from each piece of column data to construct eigenvectors, to obtain 20 eigenvectors in total. It should be noted herein that the preset quantity x may be a preset determined value, or may be a preset proportion value (indicating a proportion of a character selected from the first data to total characters in the first data). A specific indication form of the preset quantity is not specifically limited in this application. In an example, it is assumed that the preset quantity x is a determined value, and x=4. In this case, four characters are selected from each piece of column to construct a corresponding eigenvector. In another example, it is assumed that the preset quantity x is a proportion value, and x=10%. In this case, 10%×50=5 characters are selected from each piece of column to construct a corresponding eigenvector. Then, a clustering operation is performed on the m eigenvectors according to the clustering algorithm, to obtain n clusters. The obtained n clusters are obtained based on the m eigenvectors, and each eigenvector is in a one-to-one correspondence with the first data. In this way, a classification category to which each piece of first data belongs may be finally determined based on the n clusters, to obtain the n classification categories accordingly.

In the foregoing embodiment of this application, a manner of classifying the m pieces of first data according to the clustering algorithm is specifically described. The manner is feasible.

In a possible embodiment of the first aspect, a specific embodiment of classifying the m pieces of first data to obtain n classification categories may alternative be: first inputting the m pieces of first data into a neural network (for example, a CNN), and then outputting a classification category of each of the m pieces of first data by the neural network, to obtain the n classification categories, where row data or column data belonging to a same classification category is used as an associated row or column. The neural network is trained in advance by using a training set, and training data in the training set is the database data. A weight matrix of the neural network is adjusted based on the database data used for training, to obtain a finally trained neural network. The trained neural network may be directly used in this embodiment of this application to implement the process of classifying the m pieces of first data.

In the foregoing embodiment of this application, a manner of classifying the m pieces of first data through the trained neural network is specifically described. The manner is optional.

In a possible embodiment of the first aspect, that the first data block is obtained based on obtained database data includes: using some data in the database data as the first data block; or using the database data as the first data block.

In the foregoing embodiment of this application, that some data in the database data may be used as the first data block, or the entire database data may be directly used as the first data block is described. The embodiment is operable.

A second aspect of embodiments of this application provides a database data decompression method. The method includes the following operations. First, a storage device receives a data read request from an application, parses an address of a data block based on the read request, and reads compressed data (namely, compressed data) from a storage medium. Then, the storage device extracts the compressed data based on the read request, and decompressing the compressed data according to entropy coding, to obtain decompressed data. Next, the storage device performs a reverse data concatenation operation or data expansion operation on the decompressed data. For example, if a data splitting operation is performed, the data concatenation operation is performed. To be specific, bytes in a same position are scattered, and new floating-point data or new integer data is obtained through concatenation based on a length of original data (it is assumed that database data is floating-point/integer data). If a data compression operation is performed, eliminated data 0 is supplemented based on a length of original data. The associated data is predicted based on a recorded row/column data association record and according to a data prediction and transformation method, and the reverse transformation operation is performed, to obtain the row/column data. Finally, the row/column data is integrated based on a format of a database, to restore integrated data to original database data.

In the foregoing embodiment of this application, a manner of decompressing the compressed data to the original database data is specifically described. The decompression process is a reverse operation of the compression process, and is feasible.

A third aspect of embodiments of this application provides a storage device. The storage device has a function of implementing the method in any one of the first aspect or the possible embodiments of the first aspect, or the storage device has a function of implementing the method in any one of the second aspect or the possible embodiments of the second aspect. The function may be implemented by hardware, or may be implemented by hardware executing corresponding software. The hardware or the software includes one or more modules corresponding to the function.

A fourth aspect of embodiments of this application provides a computer device. The computer device may include a memory, a processor, and a bus system. The memory is configured to store a program, and the processor is configured to invoke the program stored in the memory to perform the method in any one of the first aspect or the possible embodiments of the first aspect in embodiments of this application, or the processor is configured to invoke the program stored in the memory to perform the method in any one of the second aspect or the possible embodiments of the second aspect in embodiments of this application.

A fifth aspect of embodiments of this application provides a computer-readable storage medium. The computer-readable storage medium stores instructions. When the instructions are run on a computer, the computer is enabled to perform the method in any one of the first aspect or the possible embodiments of the first aspect, or the computer is enabled to perform the method in any one of the second aspect or the possible embodiments of the second aspect.

A sixth aspect of embodiments of this application provides a computer program. When the computer program is run on a computer, the computer is enabled to perform the method in any one of the first aspect or the possible embodiments of the first aspect, or the computer is enabled to perform the method in any one of the second aspect or the possible embodiments of the second aspect.

A seventh aspect of embodiments of this application provides a chip. The chip includes at least one processor and at least one interface circuit. The interface circuit is coupled to the processor. The at least one interface circuit is configured to: perform a receiving and sending function, and send instructions to the at least one processor. The at least one processor is configured to run a computer program or the instructions. The processor has a function of implementing the method in any one of the first aspect or the possible embodiments of the first aspect, or the processor has a function of implementing the method in any one of the second aspect or the possible embodiments of the second aspect. The function may be implemented by hardware, implemented by software, or implemented by a combination of hardware and software. The hardware or the software includes one or more modules corresponding to the function. In addition, the interface circuit is configured to communicate with a module other than the chip.

BRIEF DESCRIPTION OF DRAWINGS

FIG. 1 is a schematic diagram of a general data compression algorithm;

FIG. 2 is a schematic diagram of a data storage format of a relational database according to an embodiment of this application;

FIG. 3 is a schematic diagram of a basic idea of a data compression algorithm according to an embodiment of this application;

DESCRIPTION OF EMBODIMENTS

Figure 4:
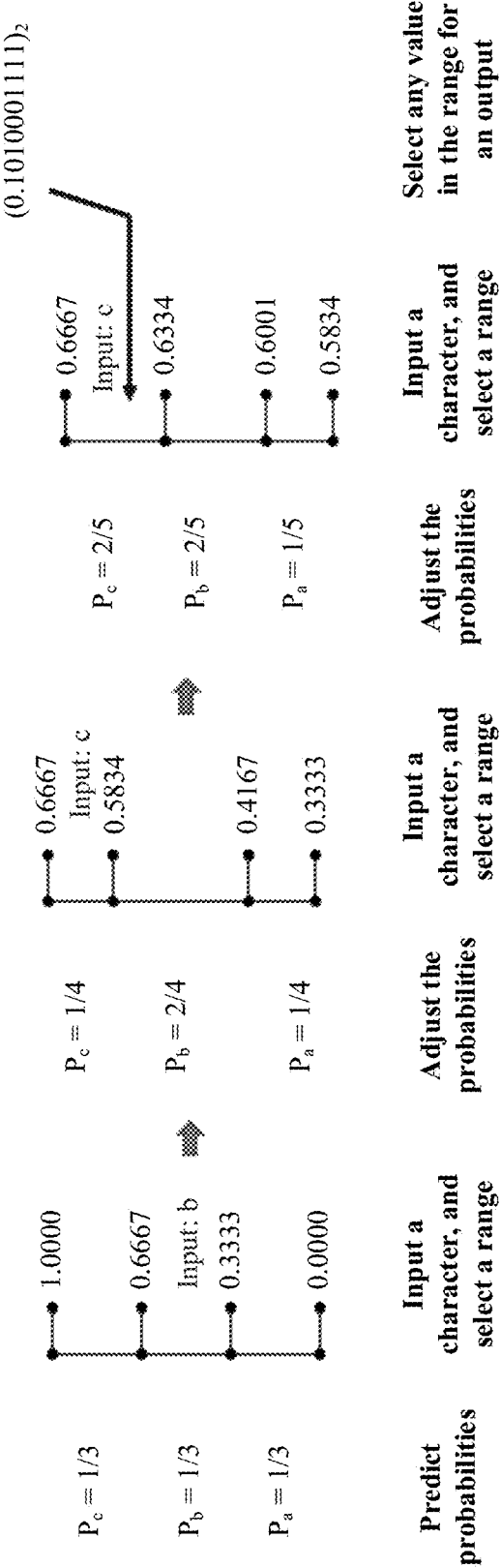
FIG. 4 is a schematic diagram of a coding process of arithmetic coding according to an embodiment of this application.

Embodiments of this application provide a database data compression method and a storage device, to classify data in different rows/columns for database data, consider row/column data belonging to a same classification category to be strongly associated with each other, and transform and compress the row data or the column data belonging to the same classification category. Because a proportion of a duplicate character in the row data or column data belonging to the same classification category is increased, a compression ratio of the database data can be improved.

In the specification, claims, and the accompanying drawings of this application, the terms "first", "second", and the like are intended to distinguish between similar objects but do not necessarily indicate a specific order or sequence. It should be understood that the terms used in such a way are interchangeable in appropriate circumstances, which is merely a discrimination manner that is used when objects having a same attribute are described in embodiments of this application. In addition, the terms "include", "contain" and any other variants mean to cover the non-exclusive inclusion, so that a process, method, system, product, or device that includes a series of units is not necessarily limited to those units, but may include other units not expressly listed or inherent to such a process, method, system, product, or device.

Embodiments of this application relate to a lot of related knowledge about a database, data compression, and the like. For ease of understanding the solutions in embodiments of this application, the following first describes related terms and concepts that may be used in embodiments of this application. It should be understood that explanations of related concepts may be limited due to specific cases of embodiments of this application, but this does not mean that this application is limited to only these specific cases, and specific cases in different embodiments may differ. This is not specifically limited herein.

(1) Database (DB)

A database is a warehouse that organizes, stores, and manages data based on data structures, and is essentially a file system that stores data in a specific format. A user can add, modify, delete, and query data in the database.

Database data is data stored in a database based on a data structure. For the database, especially a relational database like Oracle, Structured Query Language (SQL) Server, and Database 2 (DB2), the stored data is mainly structured data in a normalized format and is usually stored in a row-column form. FIG. 2 is a schematic diagram of a data storage format of a relational database according to an embodiment of this application. It can be learned from FIG. 2 that the database data is stored in a form of row data and column data.

It should be noted that the database data in embodiments of this application may also be referred to as a database file.

(2) Data Compression

Data compression is classified into lossy data compression and lossless data compression. The data compression in embodiments of this application is lossless data compression. The lossless data compression is to reduce a data amount of original data without losing useful information, to save storage space.

A data compression algorithm usually includes two parts: a prediction/transformation module and a coding algorithm. FIG. 3 is a schematic diagram of a basic idea of a data compression algorithm according to an embodiment of this application. An objective of the prediction/transformation module is to replace, with a character with a higher existence probability, a character included in input data. Specifically, prediction means that a symbol that may currently exist is predicted based on a previous symbol. Transformation means that a current symbol is replaced with a shorter character based on a prediction result.

For ease of understanding, compression in a database scenario is used as an example below for illustration. It is assumed that characters included in to-be-compressed data are respectively 1, 2, 3, 4, and 5. It may be predicted, based on two symbols 1 and 2, that a next symbol is a sum of the first two symbols, namely, 3. Then, transformation is performed on the third symbol 3 and the prediction result based on the prediction result 3 (for example, the $3^{rd}$ symbol 3 minus the prediction result), to obtain a transformed result, namely, 0. Similarly, the $4^{th}$ symbol and the $5^{th}$ symbol are predicted and transformed according to a method similar to that described above, and then transformed results are 1, 2, 0, 0, and 0. In this way, five different symbols have a same existence probability. After prediction and transformation are performed, the character 0 exists, and a probability of the character 0 is higher than that of another character.

A main objective of the coding algorithm is to represent a symbol with a higher existence probability with a shorter coding symbol based on an existence probability of the symbol.

(3) Entropy Coding Algorithm

The entropy coding algorithm may also be referred to as a coding algorithm for short. For example, arithmetic coding is a common coding algorithm. For details, refer to FIG. 4. FIG. 4 is a schematic diagram of a coding process of arithmetic coding. It is assumed that to-be-compressed data has three characters: a, b, and c. Initial inputs are respective probabilities of three predicted characters (for example, prediction is performed by the prediction model in the prediction/transformation module in FIG. 3), namely, $P_a$, $P_b$, and $P_c$. A start probability distribution range is 0 to 1. According to arithmetic coding, the probability distribution range is divided into three segments based on the probabilities of a, b, and c. If a next actual input character is b, a probability range (0.3333 to 0.6667) corresponding to b is selected as a next probability distribution range. Then, the prediction model adjusts probability distribution of all characters based on the input b, and updates $P_a$, $P_b$, and $P_c$. According to arithmetic coding, the probability range (0.3333 to 0.6667) is divided into three new segments based on updated probability distribution. If a next actual input character is c, a probability range (0.5834 to 0.6667) corresponding to c is selected as a next probability distribution range. Iteration is performed in sequence until a last character in the to-be-compressed data is input. For example, as shown in FIG. 4, the character c is input, and a selected probability distribution range is (0.6334 to 0.6667). A final compression result is any number in the range, for example, 0.64. In the schematic diagram of FIG. 4, small segments of data of three characters "bcc" are compressed into one character 0.64.

It should be noted that, in embodiments of this application, in addition to arithmetic coding, common entropy coding algorithms include Huffman coding, asymmetric numeral systems (ANS), and the like. Major differences between different types of coding lie in compression ratios and compression performance. A type of the entropy coding algorithm is not specifically limited in this application.

(4) Clustering Algorithm

Clustering relates to data point grouping. A set of data points are given, and then each data point is classified into a specific group according to the clustering algorithm. Theoretically, data points in a same group should have similar attributes and/or features, and data points in different groups should have highly different attributes and/or features.

Common clustering algorithms include k-means clustering, mean shift clustering, DBSCAN clustering, hierarchical clustering, and the like. A type of the clustering algorithm is not limited in embodiments of this application.

(5) Deep Learning

Deep learning is a subset of the field of machine learning, and machine learning is a subset of the field of artificial intelligence. Deep learning may be defined as a neural network having a large quantity of parameters and layers in the following four basic network frameworks: an unsupervised pre-training network, a convolutional neural network (CNN), a recurrent neural network (RNN), and a recursive neural network (RNN).

(6) Neural Network

A neural network may include neurons, and may be specifically understood as a neural network having an input layer, a hidden layer, and an output layer. Usually, the first layer is the input layer, the last layer is the output layer, and intermediate layers are all hidden layers. A neural network having many hidden layers is referred to as a deep neural network (DNN). Work at each layer in the neural network may be described by using a mathematical expression $\vec{y}=\alpha(W\times\vec{x}+b)$. From a physical layer, work at each layer of the neural network may be understood as completing transformation from input space to output space (namely, from row space to column space of a matrix) by performing five operations on the input space (a set of input vectors). The five operations are as follows: 1. dimension increase/dimension reduction; 2. scaling up/scaling down; 3. rotation; 4. translation; and 5. "bending". The operation 1, the operation 2, and the operation 3 are performed by "$W\times\vec{x}$", the operation 4 is performed by "+b", and the operation 5 is performed by "$\alpha(\ )$". The word "space" is used herein for expression because a classified object is not a single thing, but a type of thing. Space is a set of all individuals of such a type of thing. W is a weight matrix of each layer of the neural network, and each value in the matrix indicates a weight value of one neuron at the layer. The matrix W determines space transformation from the input space to the output space described above. In other words, W at each layer of the neural network controls how to transform space. An objective of training the neural network is to finally obtain weight matrices of all layers of a trained neural network. Therefore, a process of training the neural network is essentially learning a manner of controlling space transformation, and more specifically, learning a weight matrix.

(7) Loss Function

In a process of training a neural network, because an output of the neural network is expected to be close, as much as possible, to a predicted value that is actually expected, a predicted value of a current network may be compared with an actually expected target value, and then a weight matrix of each layer of the neural network is updated based on a difference between the predicted value and the target value (certainly, there is usually an initialization process before the first update, that is, a parameter is preconfigured for each layer of the neural network). For example, if the predicted value of the network is larger, the weight matrix is adjusted to make the predicted value smaller, and adjustment is continuously performed until the neural network can obtain the actually expected target value through prediction. Therefore, "how to obtain, through comparison, a difference between the predicted value and the target value" needs to be predefined. This is a loss function or an objective function. The loss function and the objective function are important equations that measure the difference between the predicted value and the target value. The loss function is used as an example. A larger output value (e.g., loss) of the loss function indicates a larger difference. Therefore, training of the neural network is a process of minimizing the loss as much as possible.

In the process of training the neural network, an error back propagation (BP) algorithm may be used to correct a value of a parameter in an initial neural network model, so that a reconstruction error loss of the neural network model becomes smaller. Specifically, an input signal is transferred forward until an error loss is generated in an output, and the parameter in the initial neural network model is updated through back propagation of information about the error loss, to make the error loss converge. The back propagation algorithm is an error-loss-centered back propagation motion intended to obtain an optimal parameter, for example, a weight matrix, of a neural network model.

The following describes embodiments of this application with reference to the accompanying drawings. A person of ordinary skill in the art may know that, with development of technologies and emergence of new scenarios, the technical solutions provided in embodiments of this application are also applicable to a similar technical problem.

To facilitate understanding of the method provided in embodiments of this application, the database data shown in FIG. 2 is reviewed herein. It can be further learned from the example in FIG. 2 that row data and column data in a database are strongly associated with each other. For example, there is a specific association between data in two columns of "age" and "salary", and there is a direct correspondence between data in the "salary" column and data in the "age" column. A range of "salary" may be deduced based on an age range. Based on this, embodiments of this application provide a database data compression method. In the method, data is predicted and transformed based on information about an association between row data or column data in a database, and original data is transformed into data with a high existence probability. Then, lossless compression is performed on the data according to an entropy coding algorithm, so that lossless compression of database data with a high compression ratio is implemented.

Figure 5:
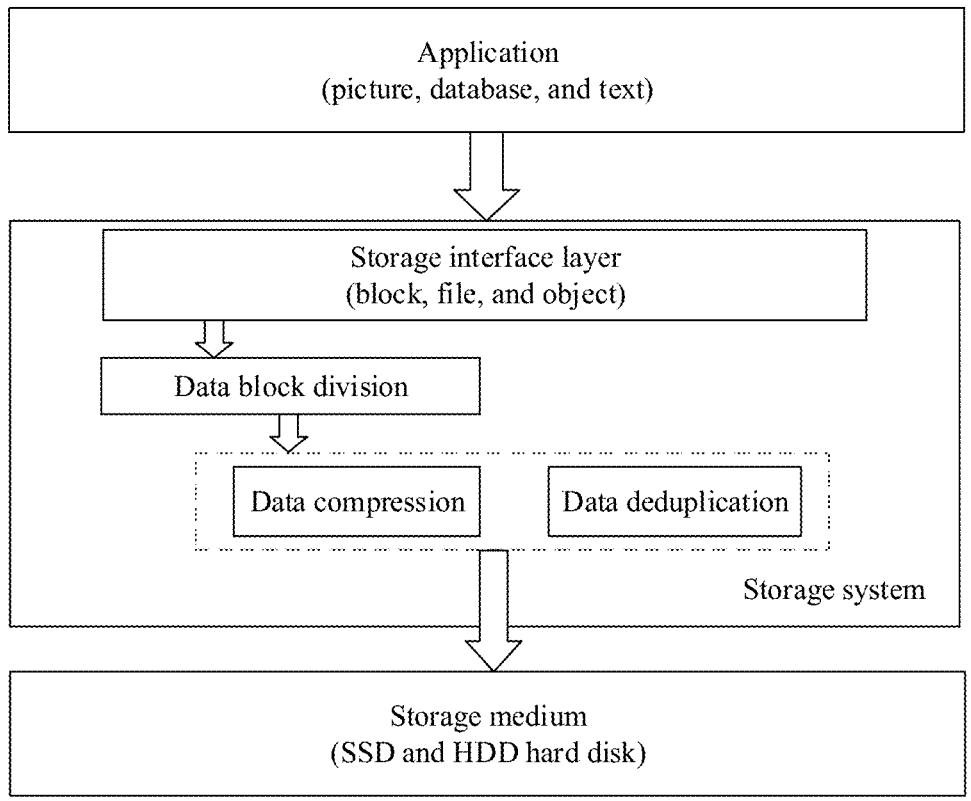
FIG. 5 is a schematic diagram of a system architecture according to an embodiment of this application.

First, a system architecture in embodiments of this application is described. For details, refer to FIG. 5. FIG. 5 is a schematic diagram of a system architecture according to an embodiment of this application. An application like a picture, a database, or a text writes data into a storage medium through a storage device (which may also be referred to as a storage system). The application may access a local storage device, or may access a remote storage device through a network. The storage device may write data into a local storage medium, or may write data into a distributed storage medium through a network.

A storage interface layer of the storage device is responsible for receiving data storage requests from the application, including a data read request and a data write request. The storage interface layer usually includes interfaces such as a block, a file, and an object. The application may access the storage device through these interfaces and according to a specified protocol. The storage device divides, based on a size of a data block and according to a specific rule, data into a block of a specified size, for example, a data block of a size of 8 KB or 32 KB. Alternatively, the storage device may directly compress an entire database file, that is, the size of the data block obtained through division is a size of the database file. Data obtained through division is processed in a data reduction procedure, including data compression and data deduplication. A main objective of data reduction is to eliminate data redundancy to reduce actual storage space required for data storage.

Data obtained through data reduction is stored in the storage medium. Currently, mainstream storage media include a high-performance solid-state drive (SSD) and a large-capacity hard disk drive (HDD). Different storage media have different requirements on compression performance of a data compression algorithm. For example, if the high-performance SSD is used, a delay of the data compression algorithm is usually at a microsecond (μs) level, and for the HDD, a tolerable delay of the data compression algorithm is usually at a millisecond (ms) level.

Figure 6:
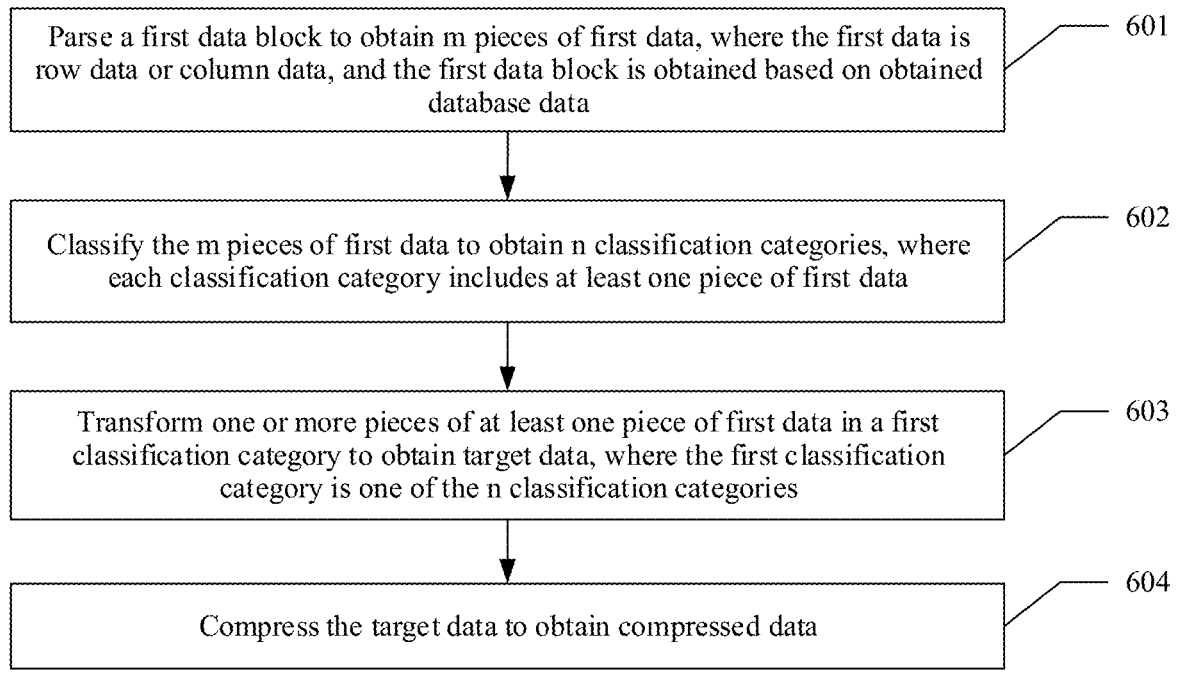
FIG. 6 is a schematic flowchart of a database data compression method according to an embodiment of this application.

The following describes a database data compression method provided in embodiments of this application. For details, refer to FIG. 6. FIG. 6 is a schematic flowchart of a database data compression method according to an embodiment of this application. The method may specifically include the following operations.

601: Parse a first data block to obtain m pieces of first data, where the first data is row data or column data, and the first data block is obtained based on obtained database data.

After receiving the database data (which is also referred to as a database file) such as data in a database like Oracle, DB2, MySQL, and SQL Server, the storage device divides the data into one or more data blocks, where the database data has specific suffixes, for example, Oracle uses .dbf as a suffix. A data block division manner may be dividing the database data based on a fixed size (for example, based on a size like 8 KB or 32 KB), or may be using the entire database data as one data block. In this embodiment of this application, regardless of whether the entire database data is used as one data block or the database data is divided into k data blocks, where k≥2, the data block may be referred to as the first data block. That is, the first data block is any one of the k data blocks, or the database data is used as the first data block. It should be noted that, in this embodiment of this application, formats of data blocks that belong to a same database are consistent.

Then, the storage device parses a format of the first data block in the database, and obtains the m pieces of first data through extraction, where m>1. It should be noted that the first data is the row data or the column data of the first data block, and an objective of parsing the format is to recognize the row/column data included in the first data block. Relational databases such as Oracle are structured data with row and column features. Generally, a column of data indicates different records of a same attribute, and a row of data indicates a plurality of attributes included in one record. In terms of a data file, data is stored in a row database by row. In other words, data in a same row is stored continuously. Data in a same column is stored continuously in a column database. Databases such as Oracle all have clear description about formats of data files. Row data or column data is extracted from the databases based on the formats.

602: Classify the m pieces of first data to obtain n classification categories, where each classification category includes at least one piece of first data.

After obtaining the m pieces of first data, the storage device further classifies the m pieces of first data according to a target algorithm, to obtain the n classification categories, where n≥1. Each classification category includes the at least one piece of first data. It should be noted herein that, in this embodiment of this application, an embodiment of classifying the m pieces of first data according to the target algorithm, to obtain the n classification categories may include but is not limited to the following two embodiments. (1) First data belonging to a same classification category may constitute a classification data set. To be specific, the m pieces of first data are classified according to the target algorithm, to obtain m classification data sets. One classification data set corresponds to one classification category, and each classification data set includes at least one piece of first data. It should be noted that, in this embodiment of this application, each classification data set may alternatively include at least two pieces of first data (in other words, a classification data set cannot be constituted when there is only one piece of first data). (2) First data belonging to a same classification category may be marked with a same identifier, and the first data having the same identifier belongs to the same classification category. In this case, there is no need to constitute a data set, and corresponding classification categories may be recognized by using only identifiers of the first data.

In this embodiment of this application, an objective of classifying the m pieces of first data is to recognize an association between data in different rows or data in different columns, and classify row data or column data with a large association together. For example, some data may be extracted from each row or each column to constitute a feature of the row or the column, and then the row data or the column data is classified according to a machine learning algorithm, for example, a clustering algorithm. Row data or column data in a same classification category can be considered as data with a large association. The classification process may also be referred to as a process of predicting semantics of the database data. First-layer semantics is predicted: recognizing an association between row data or column data.

It should be noted that, in this embodiment of this application, there may be a plurality of types of target algorithms for classifying the m pieces of first data, including but not limited to the machine learning algorithm, for example, a clustering algorithm (for example, k-means clustering, mean drift clustering, density-based spatial clustering with noise (DBSCAN) clustering, or hierarchical clustering) or a deep learning algorithm (for example, a CNN or an RNN). Examples in which the target algorithm is a machine learning algorithm or a deep learning algorithm are used below for illustration.

1. A Case in which the Target Algorithm is a Machine Learning Algorithm

When the target algorithm is the machine learning algorithm, for example, a clustering algorithm, a manner of classifying the m pieces of first data according to the target algorithm is to classify the m pieces of first data according to the clustering algorithm.

A specific classification process may include the following operations. First, a preset quantity of characters are selected from each of the m pieces of first data to construct m eigenvectors, where one eigenvector corresponds to one piece of first data. For example, it is assumed that the first data block includes 20 pieces of column data (namely, m=20, and it is assumed that the first data is column data), and each piece of column data includes 50 characters. In this case, the storage device may select the preset quantity of characters from each piece of column data to construct an eigenvector, to obtain 20 eigenvectors in total. It should be noted herein that the preset quantity x may be a preset determined value, or may be a preset proportion value (indicating a proportion of a character selected from the first data to total characters in the first data). A specific indication form of the preset quantity is not specifically limited in this application. In an example, it is assumed that the preset quantity x is a determined value, and x=4. In this case, four characters are selected from each piece of column data to construct a corresponding eigenvector. In another example, it is assumed that the preset quantity x is a proportion value, and x=10%. In this case, 10%×50=5 characters are selected from each piece of column data to construct a corresponding eigenvector. Then, a clustering operation is performed on the m eigenvectors according to the clustering algorithm, to obtain n clusters. The obtained n clusters are obtained based on the m eigenvectors, and each eigenvector is in a one-to-one correspondence with the first data. In this way, a classification category to which each piece of first data belongs may be finally determined based on the n clusters, to obtain the n classification categories accordingly.

Figure 7:
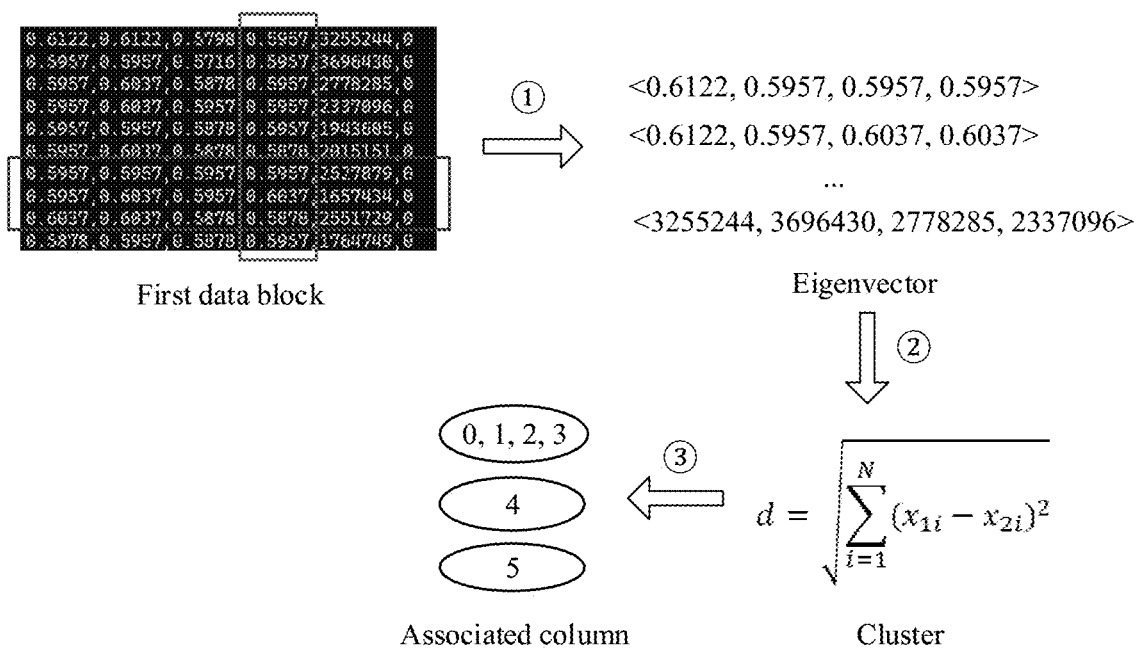
FIG. 7 is a schematic flowchart of classifying m pieces of first data in a first data block according to a clustering algorithm according to an embodiment of this application.

For ease of understanding, a process of recognizing and classifying associated column data according to a lightweight machine learning algorithm, for example, a clustering algorithm, is described below by using an example in which the first data is column data. For details, refer to FIG. 7. FIG. 7 is a schematic flowchart of classifying the m pieces of first data in the first data block according to the clustering algorithm according to an embodiment of this application. The classification process may include the following operations.

Operation 1: Construct eigenvectors of all column data.

First, the eigenvectors are constructed for all the column data, and the eigenvectors are used as features indicating the column data. The eigenvectors are constructed by selecting a specific quantity (for example, the preset quantity x described above) of characters from the column data through sampling (for example, random sampling) or in another manner. As shown in FIG. 7, four characters may be selected from each piece of column data to construct a four-dimensional eigenvector.

It should be noted herein that, in some embodiments of this application, positions of the characters selected from each piece of column data may be consistent in the piece of column data. For example, the $1^{st}$ to $4^{th}$ (or may be located in another position) characters that are arranged in sequence in each piece of column data may be selected from the piece of column data to construct the four-dimensional eigenvector.

Operation 2: Cluster the constructed eigenvectors according to the clustering algorithm.

The selected eigenvectors are clustered according to the clustering algorithm (for example, a k-means clustering algorithm). An essence of the clustering algorithm is to calculate a distance between vectors, which is shown in FIG. 7. Xii is an $i^{th}$-dimension feature of an eigenvector 1, N is a quantity of dimensions of the vector, and d indicates a distance obtained through calculation. A smaller distance indicates a stronger association.

It should be noted that, in this embodiment of this application, there are several manners of determining whether all the column data belongs to one cluster, including but not limited to: (1) predefining a quantity of clusters (for example, three clusters), where classification categories to which all the column data separately belongs are determined according to the clustering algorithm; or (2) predefining a distance threshold of a same cluster, where if a distance between two eigenvectors is less than the distance threshold, the two eigenvectors belongs to a same classification category.

Operation 3: Classify the column data based on a clustering result.

Finally, the column data is classified based on the clustering result. Column data belonging to a same classification category can be considered as associated column data. For example, data in columns 0, 1, 2, and 3 is associated, and data in columns 4 and 5 is independent.

2. A Case in which the Target Algorithm is a Deep Learning Algorithm

When the target algorithm is the deep learning algorithm, a manner of classifying the m pieces of first data according to the target algorithm is to classify the m pieces of first data according to the deep learning algorithm.

Figure 8:
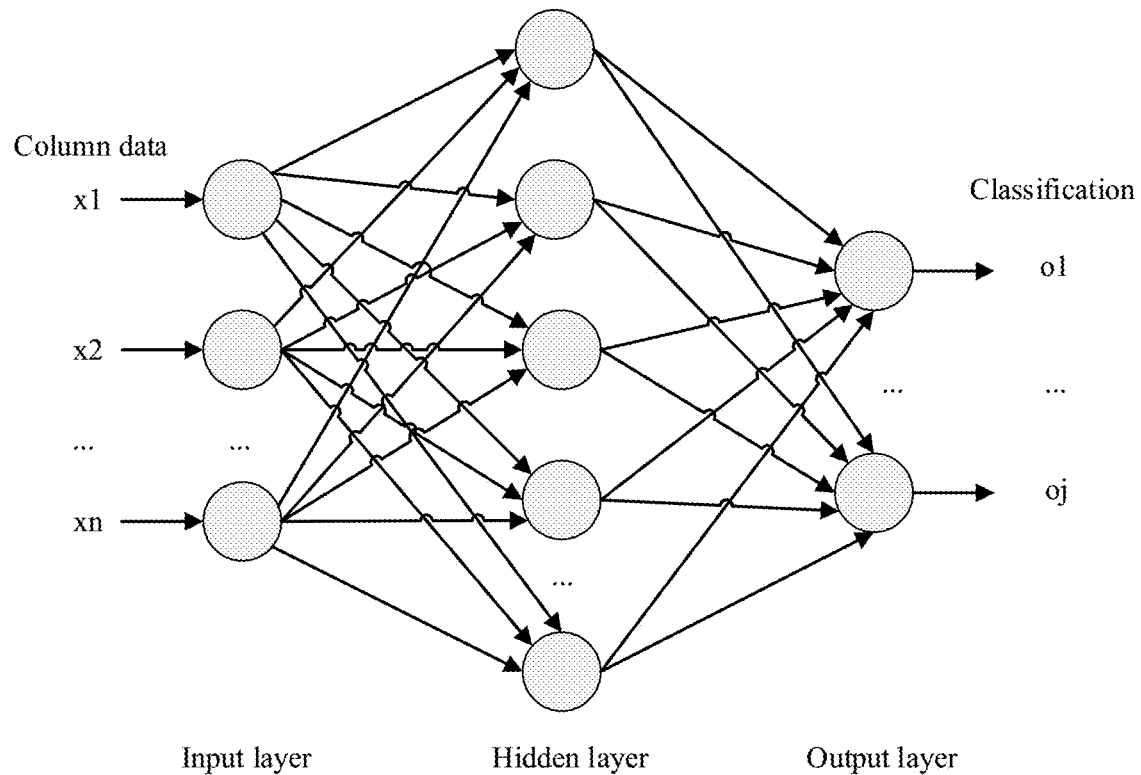
FIG. 8 is a schematic diagram of classifying m pieces of first data in a first data block according to a deep learning algorithm according to an embodiment of this application.

A specific classification process may include: first inputting the m pieces of first data into a neural network (for example, a CNN), and then outputting a classification category of each of the m pieces of first data by the neural network. As shown in FIG. 8, each piece of row data or each piece of column data is used as inputs x1, x2, . . . , and xn of the neural network, and outputs o1, . . . , and oj of the neural network are used as classifications of the row data or the column data. It should be noted that the neural network is trained in advance by using a training set, and training data in the training set is database data. A weight matrix of the neural network is adjusted based on the database data used for training, to obtain a finally trained neural network. The trained neural network may be directly used in this embodiment of this application to implement the process of classifying the m pieces of first data.

In the foregoing embodiment of this application, regardless of whether the target algorithm is the machine learning algorithm or the deep learning algorithm, both algorithms are used to recognize an association between all the first data in the m pieces of first data, and classify each piece of first data based on an association relationship.

603: Transform one or more pieces of at least one piece of first data in a first classification category to obtain target data, where the first classification category is one of the n classification categories.

After obtaining the n classification categories, the storage device transforms the one or more pieces of the at least one piece of first data in each of the n classification categories (namely, the first classification category), to obtain the target data.

It should be noted that, in this embodiment of this application, there may be a plurality of manners of performing a transformation operation on the first data in the first classification category, including but not limited to the following several manners.

1. Concatenate the first data in the first classification category, where concatenated data constitutes the target data.

A transformation operation performed on the one or more pieces of the at least one piece of first data in the first classification category is: when there are a plurality of pieces of first data in the first classification category, directly concatenating all the first data in the first classification category, where concatenated data constitutes to-be-compressed target data. Because to-be-concatenated data is associated with each other (in other words, all to-be-concatenated data belongs to a same classification category), the concatenated data may have a large amount of redundancy, which is easy to be recognized by a compression algorithm.

Figure 9:
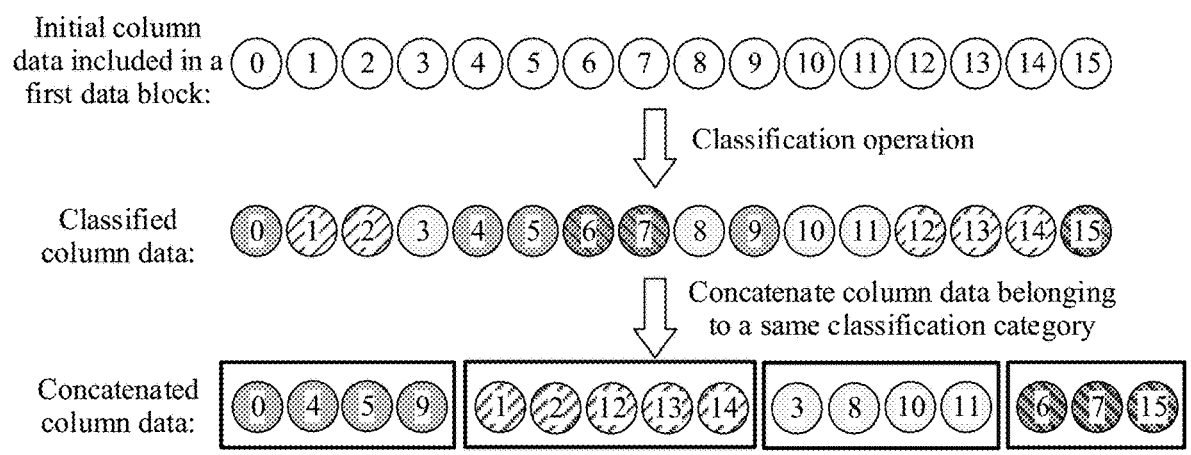
FIG. 9 is a schematic diagram of performing a transformation operation on first data in each classification category according to an embodiment of this application.

For ease of understanding, an example is used below for illustration. For details, refer to FIG. 9. FIG. 9 is a schematic diagram of performing a transformation operation on first data in each classification category according to an embodiment of this application. In FIG. 9, an example in which the first data is column data is used for illustration. It is assumed that an original first data block includes 16 columns of data in total that are numbered 0 to 15 (as shown in a first row in FIG. 9), and each number indicates one column of data. In addition, it is further assumed that there are four classification categories (namely, n=4) in total obtained by performing the classification operation in operation 602, and in each classification category, there is first data corresponding to the classification category. As shown in FIG. 9, backgrounds having different numbers indicate different classification categories. It can be learned from FIG. 9 that column data belonging to a classification category 1 is 0, 4, 5, and 9, column data belonging to a classification category 2 is 1, 2, 12, 13, and 14, column data belonging to a classification category 3 is 3, 8, 10, and 11, and column data belonging to a classification category 4 is 6, 7, and 15 (as shown in a second row in FIG. 9). In the column data included in the four classification categories, some pieces of column data are adjacent, and some pieces of column data are separated by other column data. In this way, a transformation operation is to concatenate column data belonging to a same classification category. As shown in FIG. 9, the column data 0, 4, 5, and 9 are concatenated together (in other words, an original position of the column data is adjusted), so that several columns of data are located in an adjacent position of the first data block. Similarly, similar concatenation processing is performed on column data included in other three classification categories. A concatenated result is shown in a third row in FIG. 9. In this case, the column data 0, 4, 5, and 9 are concatenated together to constitute one piece of target data, and the target data includes four columns of data. The column data 1, 2, 12, 13, and 14 are concatenated together to constitute one piece of target data, and the target data includes five columns of data. The column data 3, 8, 10, and 11 are concatenated together to constitute one piece of target data, and the target data includes four columns of data. The column data 6, 7, and 15 are concatenated together to constitute one piece of target data, and the target data includes three columns of data.

It should be noted that, in this embodiment of this application, an arrangement sequence of different classification categories is not limited. A new first data block may be constituted by sequentially arranging the classification category 1, the classification category 2, the classification category 3, and the classification category 4; or a new first data block may be constituted by sequentially arranging the classification category 4, the classification category 3, the classification category 2, and the classification category 1; or a new first data block may be constituted by arranging in a sequence of the classification category 3, the classification category 1, the classification category 4, and the classification category 2; or a new first data block may be constituted by randomly arranging the classification categories. A manner of arranging different classification categories is not specifically limited in embodiments of this application.

It should be further noted that, in this embodiment of this application, an arrangement sequence of column data belonging to a same classification category is not limited. For example, in FIG. 9, column data originally located in positions 0, 4, 5, and 9 in the first data block belongs to a same classification category, and the four pieces of column data may be randomly arranged in positions in the classification category, or may be arranged in a sequence of original positions (as shown in FIG. 9). This is not specifically limited in this application.

It should be noted herein that, in the foregoing embodiment of this application, a reason for concatenating the first data in the first classification category to constitute the target data is as follows: Because first data in a same classification category belongs to the same classification category (that is, a large association, and a larger association indicates more similar data), it indicates that proportions and/or a quantity of duplicate characters included in different first data in the same classification category are increased compared with those before classification. In this way, a compression ratio of the database data can also be improved based on only a first-layer semantic prediction result of the database data (that is, recognizing an association between row data or column data).

2. Recognize a transformation relationship between the first data in the first classification category to obtain the target data.

Another transformation operation performed on the one or more pieces of the at least one piece of first data in the first classification category is as follows: when there are a plurality of pieces of first data in the first classification category, selecting at least one piece of first data from the first classification category as reference data; then predicting, based on the selected at least one piece of reference data, other first data (which may be referred to as non-reference data) that is in the first classification category and that is not the reference data, to obtain predicted data, where one piece of non-reference data corresponds to one piece of predicted data; and finally obtaining the final target data based on the non-reference data and the obtained predicted data.

In this embodiment of this application, a process of recognizing the transformation relationship between the first data in the first classification category may be referred to as another process of predicting semantics of the database data. Second-layer semantics is predicted: recognizing a transformation relationship between row data or column data.

For ease of understanding, the first data block including 16 columns of data (namely, column data numbered 0 to 15 respectively) in FIG. 9 is still used as an example for illustration. In FIG. 9, it is assumed that there are four classification categories in total obtained by performing the classification operation in operation 602, namely, a classification category 1, a classification category 2, a classification category 3, and a classification category 4. Column data belonging to the classification category 1 is 0, 4, 5, and 9, column data belonging to the classification category 2 is 1, 2, 12, 13, and 14, column data belonging to the classification category 3 is 3, 8, 10, and 11, and column data belonging to the classification category 4 is 6, 7, and 15 (as shown in the second row in FIG. 9). For the classification category 1 including the column data 0, 4, 5, and 9, one piece of column data is selected from the classification category 1 as reference data. It is assumed that the selected reference data is the column data numbered 0. In this case, non-reference data in the classification category 1 is three columns of data numbered 4, 5, and 9. Then, the three columns of non-reference data are separately predicted based on the column data numbered 0, to obtain three columns of predicted data. Finally, the final target data is obtained based on the three columns of non-reference data and the corresponding predicted data. Similarly, similar transformation operations may also be performed on the classification category 2, the classification category 3, and the classification category 4, to obtain target data corresponding to the respective classification categories. Details are not described in this application.

It should be noted herein that, in the foregoing embodiment of this application, the selected reference data is a fixed column of data. In other words, the reference data 0 is used for predicting the column data 4, 5, and 9. In actual application, the reference data may be preferably selected or dynamically adjusted. In an example, the column data 0 is selected during first prediction, and then the column data 4, 5, and 9 are predicted based on the column data 0, to obtain three pieces of predicted data; the column data 4 is selected during second prediction, and then the column data 0, 5, and 9 are predicted based on the column data 4, to obtain three pieces of predicted data; and the like, until each piece of column data in the classification category 1 is used as the reference data to predict other column data. Finally, an optimal piece of column data is selected as the reference data based on a prediction result (in other words, the reference data is preferably selected). In another example, the column data 0 may alternatively be used as reference data to predict the column data 4, which may also be referred to as that the column data 0 is the reference data of the column data 4. Alternatively, the column data 4 may be used as reference data of the column data 5, and the column data 9 may be used as reference data of the column data 0. That is, one piece of column data may be used as reference data of other column data, or may be used as non-reference data that is to be predicted based on reference data (in other words, the reference data is dynamically adjustable).

It should be further noted that, in the foregoing embodiment of this application, the selected reference data is one column of data. In actual application, the selected reference data may be a plurality of columns of data (or may be a plurality of rows of data, and column data is used as an example herein). For example, column data 0 and 4 both are used as the reference data (in other words, there are two pieces of reference data) to predict the column data 5 and 9, or column data 0, 4, and 5 all are used as the reference data (in other words, there are three pieces of reference data) to predict the column data 9. A quantity of reference data selected from a classification category is not specifically limited in this application, provided that a quantity of first data in the classification category minus a quantity of reference data is greater than 1 (in other words, there is still non-reference data in the classification category).

It should be further noted that, in some embodiments of this application, a process of predicting the non-reference data in the first classification category based on the reference data, to obtain predicted data may specifically include: first predicting an association relationship between the reference data and the non-reference data in the first classification category, to obtain a transformation formula; and then predicting the non-reference data based on the reference data and the transformation formula, to obtain the predicted data. In other words, a transformation relationship between reference data and non-reference data is reflected by the transformation formula. According to the transformation formula, the predicted data corresponding to the non-reference data may be obtained based on the reference data. Specifically, in some embodiments of this application, the association relationship between the reference data and the non-reference data in the first classification category may be predicted by using a linear regression equation. In some other embodiments of this application, the association relationship between the reference data and the non-reference data in the first classification category may alternatively be predicted by using a non-linear model (for example, a quadratic model). This is not specifically limited in this application.

It should be further noted that in some embodiments of this application, after obtaining predicted data corresponding to each piece of non-reference data, the storage device further obtains transformation data based on the non-reference data and the corresponding predicted data. Specifically, a difference between the non-reference data and the corresponding predicted data is used as the transformation data, or a product of a preset coefficient and a difference between the non-reference data and the corresponding predicted data is used as the transformation data, where one piece of transformation data corresponds to one piece of non-reference data. For example, it is assumed that there are three pieces of non-reference data in total in a specific classification category (it is assumed that each piece of non-reference data is denoted as Y). After the foregoing transformation operation is performed, each piece of non-reference data corresponds to one piece of predicted data, and there are three pieces of predicted data in total (it is assumed that each piece of predicted data is denoted as Y'). In this case, Y"=Y—Y', or Y"=p×(Y—Y'). Herein, p is the preset coefficient, and Y" is the transformation data. Each piece of non-reference data has one piece of corresponding transformation data.

After obtaining the transformation data corresponding to each piece of non-reference data, the storage device may directly use the transformation data as the target data, where one piece of transformation data corresponds to one piece of target data. If there are at least two pieces of transformation data, the storage device may alternatively concatenate the at least two pieces of transformation data to obtain the target data. This is not specifically limited in this application. However, it should be noted that, in this embodiment of this application, a manner of concatenating the transformation data is similar to the foregoing manner of concatenating the first data belonging to the same classification category. For details, refer to the foregoing description. Details are not described herein again.

It should be further noted that, in some other embodiments of this application, to further eliminate data redundancy, after obtaining the transformation data, the storage device may further perform a redundant data cleanup operation on the transformation data, for example, operations such as data splitting and data compaction, to obtain cleaned transformation data. A compression ratio of the cleaned transformation data can be further improved. For example, for transformed database data of a numeric type like a floating point or an integer, a single piece of data may include four or eight bytes, and most-significant data may have a large amount of redundancy 0. Data splitting is mainly splitting performed on long-byte data by byte. Bytes in a same position (for example, each byte is a first byte) are continuously stored. Data compaction is mainly elimination of redundancy 0 in most-significant data. For example, if first two bytes of all data are 0, the two bytes are directly eliminated. In the operation, a data cleanup manner needs to be recorded. If a data splitting operation is performed, information such as a quantity of split bytes is recorded; or if a data compaction operation is performed, a length of the eliminated data 0 is recorded.

It should be noted that an objective of performing the redundant data cleanup operation is to eliminate redundant data after transformation. The operation is mainly performed for database data of a numeric type like a floating point or an integer. Certainly, the operation is alternatively performed for other database data. The operation may be performed for any database type, but a redundancy elimination effect is better for the database data of the numeric type like the floating point or the integer.

After obtaining the cleaned transformation data, the storage device may directly use the cleaned transformation data as the target data, where one piece of cleaned transformation data corresponds to one piece of target data. If there are at least two pieces of cleaned transformation data, the storage device may alternatively concatenate the at least two pieces of cleaned transformation data to obtain the target data. This is not specifically limited in this application. It should also be noted that, in this embodiment of this application, a manner of concatenating the cleaned transformation data is similar to the foregoing manner of concatenating the first data belonging to the same classification category. For details, refer to the foregoing description. Details are not described herein again.

In the foregoing embodiment of this application, based on the predicted first-layer semantics (that is, recognizing the association between row data or column data), the second-layer semantics (that is, recognizing the transformation relationship between row data or column data) is further predicted, to obtain the predicted data. Then, data transformation is performed on original data based on the predicted data, so that complex original data is transformed into simplified data with a high duplicate rate. This further improves a compression ratio of subsequent data compression.

In addition, it should be further noted that, in the foregoing embodiments of this application, when there is only one piece of first data in the first classification category, at least one first character may be selected from the first data as a reference character, and then another character (which may be referred to as a non-reference character) that is in the first data and that is not the reference character is predicted based on the selected at least one reference character, to obtain a predicted character, where one non-reference character corresponds to one predicted character. Finally, a final target character is obtained based on the non-reference character and the obtained predicted character, and then all obtained target characters and non-reference characters constitute the to-be-compressed target data. In this embodiment of this application, the reference character is similar to the foregoing reference data, the non-reference character is similar to the foregoing non-reference data, the first character is similar to the foregoing first data, and the predicted character is similar to the foregoing predicted data. A specific prediction process is similar to the foregoing process. For details, refer to the foregoing description. Details are not described herein again. It should be further noted that when there are a plurality of pieces of first data in the first classification category, a transformation relationship between different characters in a same piece of first data may alternatively be predicted. This is not limited in this application.

For ease of understanding, column data of a numeric type like a floating point or an integer is used as an example below for illustration. A specific recognition process includes the following operations.

Operation 1: Recognize a data type of each column of data.

Numeric conversion of data is performed for data of a numeric type like a floating point or an integer (a manner for another data type is similar).

Operation 2: Predict a transformation relationship between data in associated columns.

A transformation relationship between data in a same column or data in associated columns is predicted. A prediction method may be: selecting some characters (a selection manner is similar to the foregoing manner), and predicting an association between characters in data in a same column and/or an association between data in different columns through linear regression or by using another method. It should be noted herein that, in this embodiment of this application, a manner of selecting some characters is similar to the foregoing manner of selecting a specific quantity of characters for constructing the eigenvector. For details, refer to the foregoing description. Details are not described herein again.

Operation 3: Perform prediction and transformation on column data.

Next piece of data is predicted based on the data association, and then a residual (actual data minus predicted data) of the data is obtained. The residual is the target data, and is used as subsequent to-be-compressed data.

It should be noted that, for ease of understanding a manner of predicting the transformation relationship between different characters in data in a same column, an example is used herein for illustration. For example, it is assumed that a value arrangement sequence of data in a specific column is 101, 102, 103, 104, and the like. In this case, the predicted transformation relationship may be a value in a next position minus a value in a previous position, so that obtained transformation data is 1, 1, 1, 1, and the like. A character duplicate rate in the transformation data is significantly increased compared with that before the transformation.

For ease of understanding the foregoing three operations, a specific example is used to describe the foregoing operations. For associated row or column data, for example, column data X(x1, x2, . . . , and xn) and column data Y(y1, y2, . . . , and yn), X is used as reference data, and may be in any column in a same classification category. A data association between x and y needs to be obtained. It should be noted herein that, when the transformation relationship between different characters in data in a same column is predicted, x1, x2, . . . , and xn are specific characters in data in a specific column. When the transformation relationship between data in different columns is predicted, x1, x2, . . . , and xn are data in some specific columns. Data prediction means that data Y' of Y is predicted based on data of X, and then data Y is transformed based on a prediction result Y'. Regression analysis in machine learning, for example, a linear regression equation, may be used as a data prediction method. A multi-variable linear regression model is shown in the following formula (1):

$$yi' = \beta 0 + \beta 1 \times xi + \beta 2 \times x(i+1) + \ldots + \beta p \times x(i+p) + \varepsilon, \text{ where } i = 1, 2, \quad (1)$$

$\beta$ and $\varepsilon$ are parameters of the model, x corresponds to column data X, and y' is predicted data of Y. A calculation manner of $\beta$ and $\varepsilon$ is as follows: selecting p pieces of data of X, namely, x1, x2, . . . , and xp, and selecting p pieces of data of Y, namely, y1, y2, . . . , and yp in corresponding positions, to constitute an equation set shown in the following formula (2):

$$y1 = \beta 0 + \beta 1 \times x1 + \beta 2 \times x2 + \ldots + \beta p \times xp + \varepsilon \quad (2)$$
$$y2 = \beta 0 + \beta 1 \times x2 + \beta 2 \times x3 + \ldots + \beta p \times x(p+1) + \varepsilon$$
$$\ldots$$
$$yp = \beta 0 + \beta 1 \times x(p+1) + \beta 2 \times x(p+2) + \ldots + \beta p \times x(p+p) + \varepsilon$$

Values of $\beta$, $\beta 1$ . . . $\beta p$, and c may be obtained by solving the foregoing equations.

Simply speaking, if $\beta 2$, . . . , $\beta p$, and $\varepsilon$ are 0, and $\beta 1$ is 1, yi'=xi. In addition, in addition to the linear regression model, other models such as a non-linear model may be used for expression, for example, a quadratic model yi'=xi^2.

A prediction result of a relationship between the associated row data or associated column data is used to guide data transformation. There are a plurality of data transformation manners, and a most intuitive manner is to calculate a residual of data. That is, Y"=Y—Y'. The original data Y minus the predicted data Y' is the residual Y", and the obtained residual Y" is used as transformed data (namely, the transformation data). Compared with that of the original data Y, a value range of the transformed data Y" is smaller. To be specific, a quantity of different transformed characters is reduced, and an existence probability of a single character is increased. If data of Y' is the same as that of Y, a prediction result is accurate. All characters in Y" are 0, only one character 0 exists, and an existence probability is 100%. A smaller quantity of to-be-compressed characters indicates a higher existence probability of a single character. According to an information entropy theory, a smaller length required for entropy coding indicates a larger compression ratio.

In addition, in some embodiments of this application, a data prediction process and a data transformation process may be further combined. It is assumed that a prediction model is yi'=xi, and a transformation mode is y"=y-y'. In this case, a combined result is y"-y-y'-y-x.

In the foregoing embodiments of this application, characters in associated row data or associated column data (or same row/column data) are transformed. For example, a difference between actual data and predicted data is used as the transformed data. The transformed data is predicted. If prediction precision is high, a value of predicted data is less than that of original data, and a quantity of symbols is smaller. For example, values of all transformed most-significant data are 0. In this way, a higher existence probability of a single character in the obtained to-be-compressed data indicates a larger compression ratio.

604: Compress the target data to obtain compressed data.

After the target data is obtained based on the transformation data, the target data is compressed according to an entropy coding algorithm, for example, arithmetic coding or ANS, to obtain the compressed data. Entropy coding is divided into two operations. In the first operation, a single byte is usually used as a character granularity to collect statistics on a character existence probability. Probability statistics may be static statistics, that is, statistics on probabilities of all characters in a to-be-compressed data block are collected; or may be dynamic statistics, that is, a probability of a character changes with an input of to-be-compressed data. This is not specifically limited in this application. In the second operation, the data is compressed according to the entropy coding and based on the character existence probability. In this operation, the character probability and the compressed data are recorded, and all the data is stored in the storage device.

Figure 10:
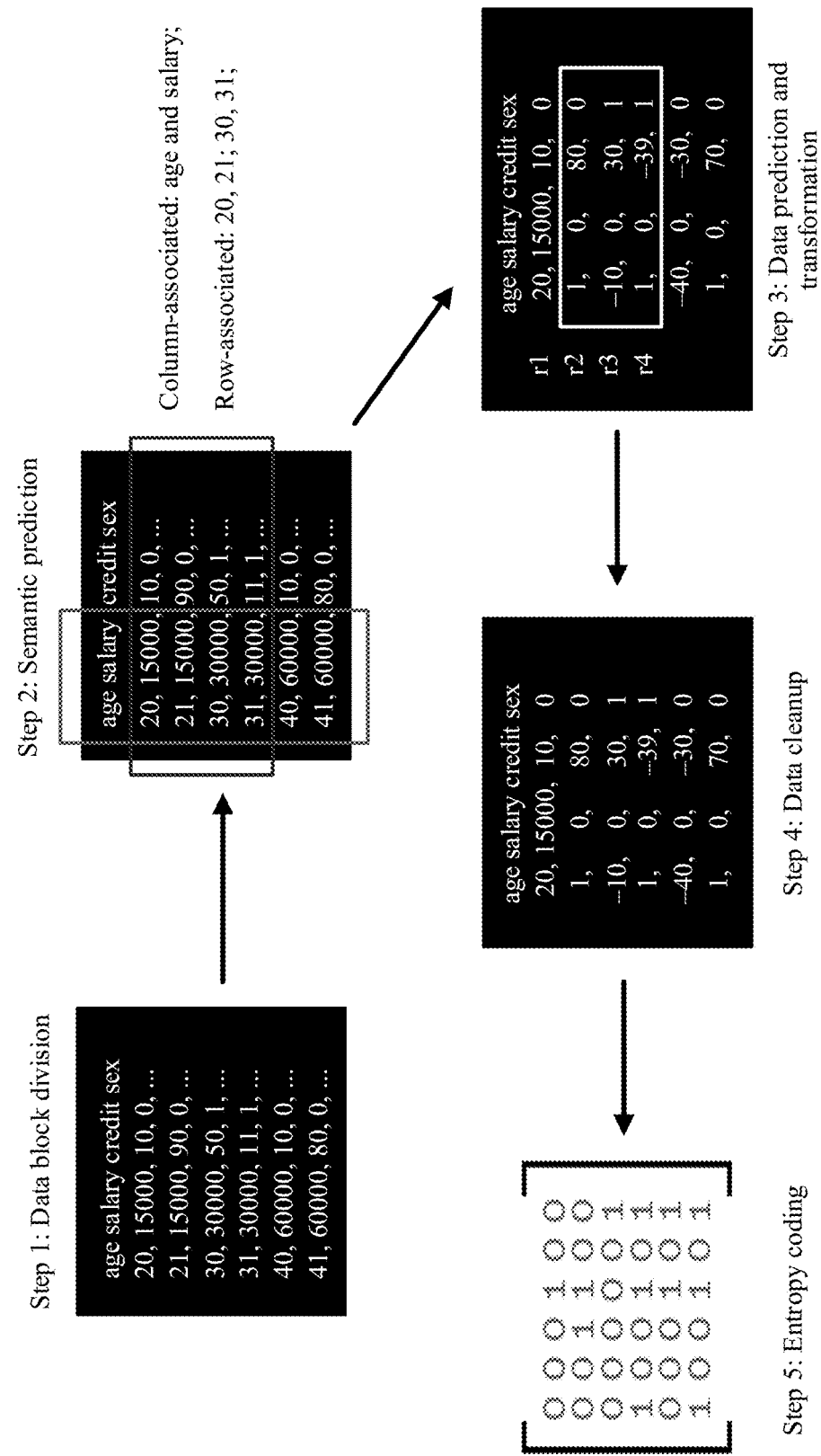
FIG. 10 is another schematic flowchart of a database data compression method according to an embodiment of this application.

For ease of understanding the operation 601 to operation 604, the following summarizes the foregoing operation process by using a specific example. For details, refer to FIG. 10. FIG. 10 is another schematic flowchart of a database data compression method according to an embodiment of this application. The method may include the following operations.

Operation 1: Data Block Division

First, a database file (namely, database data) is obtained, a format of a data file is parsed, and row/column data in a database is recognized. For example, "age", "salary", "credit", "sex", and the like in FIG. 10 indicate different attributes of the database. Several pieces of data corresponding to a same attribute, such as 20, 21, and 30, are data in a same column. One record includes the four attributes. For example, 20, 15000, 10, and 0 are data in a same row. It should be noted that, in FIG. 10, after the database data is divided into a data block in operation 1, at least one data block is obtained. The data block shown in operation 1 is any one of data blocks obtained through division, namely, a first data block.

Operation 2: Semantic Prediction

In the operation, semantics of row/column data is predicted. First, an association relationship between row data or column data is recognized (in other words, first-layer semantics is predicted). For example, a column "age" is associated with a column "salary". The $1^{st}$ data row r1<20, 15000, 10, 0> is associated with the $2^{nd}$ data row r2<21, 15000, 90, 0>. Further, a transformation relationship between associated row data or associated column data is predicted (in other words, second-layer semantics is predicted). For example, in a simple manner, prediction is performed on r2 based on r1, and then r2'=r1 is obtained through the prediction. In a complex manner, a relationship between r2' and r1 may be indicated by a multivariate multidimensional formula.

Operation 3: Data Prediction and Transformation

In the operation, data is transformed based on a semantic prediction result. For example, a residual operation r2"=r2-r2' is performed on original data and predicted data (or another operation may be performed, for example, adding or subtracting a specific coefficient, and a principle is that a larger quantity of same symbols after transformation is preferred, and whether the transformed symbols are zero is not concerned), and r2" is used as a transformed result. As shown in FIG. 10, r2<21, 15000, 90, 0> is transformed into r2"<1, 0, 80, 0>.

Operation 4: Data Cleanup

In the operation, a data splitting operation or a data compaction operation is performed on the transformed data. As shown in FIG. 10, each piece of original integer data needs to be indicated by four bytes (an indication range is 0 to $2^{32}$ or $-2^{32}$ to $2^{32}$). However, an indication range of most of transformed data is <0, 100>, only one byte is required for an indication (an indication range is 0 to $2^8$ or $-2^7$ to $2^7$), and three most-significant bytes are all 0. The data compression operation means that the transformed data is indicated by one byte, and other three bytes are deleted because all the three bytes are 0. In this way, original integer/floating-point data can be transformed into small data with a high duplicate rate by using a row/column semantic association of the database, so that a compression ratio is improved.

It should be noted herein that, in some other embodiments of this application, the data cleanup operation may not be performed. For example, for a text-type database, operation 4 may not be performed.

Operation 5: Entropy Coding

In the operation, to-be-compressed data obtained through data cleanup is compressed according to a coding algorithm, for example, arithmetic coding or ANS, to obtain the compressed data.

In the foregoing embodiments of this application, for the database data, a semantic association (for example, prediction performed on the first-layer semantics, the second-layer semantics, and the like) between data in different rows or data in different columns in the database data is obtained according to a clustering algorithm or a deep learning algorithm, classifications of the data in different rows or the data in different columns, prediction on the transformation relationship between the data in different rows or the data in different columns, and the like are performed based on the semantic association, and then transformation (for example, operations such as data concatenation, data splitting, and data compaction) and compression are performed on row data or column data belonging to a same classification category. Because a proportion of a duplicate character in the row data or column data belonging to the same classification category is increased, a compression ratio of the database data can be improved after an entropy coding algorithm is used.

Figure 11:
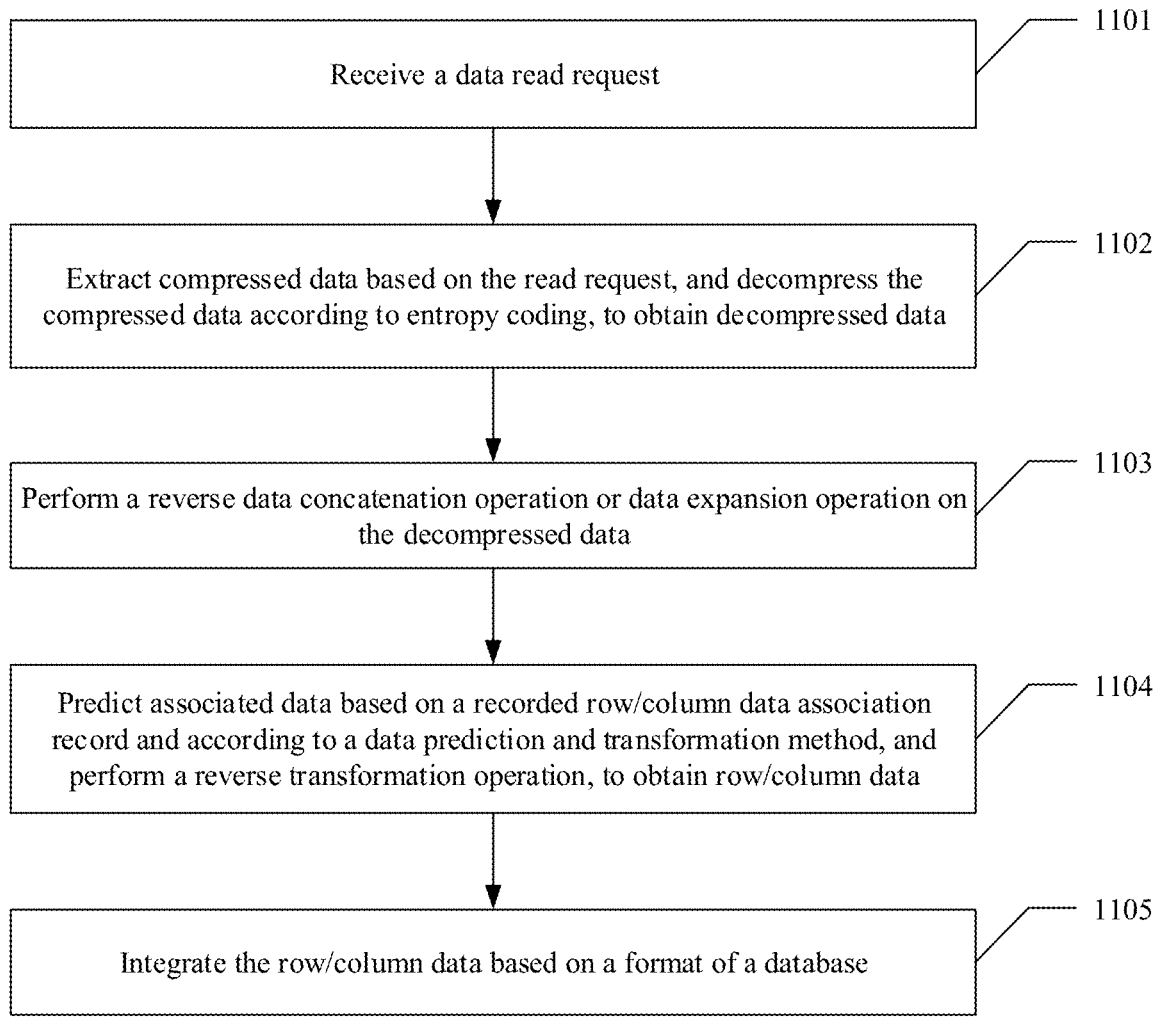
FIG. 11 is a schematic flowchart of a database data decompression method according to an embodiment of this application.

It should be noted that the database data compression method is described in the foregoing embodiments of this application. Similarly, when compressed data in a storage device needs to be read, a reverse decompression operation is performed. The decompression method is a reverse operation of the database data compression method provided in embodiments of this application. For details, refer to FIG. 11. FIG. 11 is a schematic flowchart of a database data decompression method according to an embodiment of this application. The method may specifically include the following operations.

1101: Receive a data read request.

First, the storage device receives the data read request from an application, parses an address of a data block based on the read request, and reads compressed data (namely, compressed data) from a storage medium.

1102: Extract the compressed data based on the read request, and decompressing the compressed data according to entropy coding, to obtain decompressed data.

Then, the compressed data is extracted based on the read request, where the compressed data includes character probability distribution, and data obtained through prediction and transformation is obtained through decompression based on the probability distribution and according to an entropy coding algorithm.

1103: Perform a reverse data concatenation operation or data expansion operation on the decompressed data.

A reverse data cleanup operation is performed on the decompressed data in a recorded data cleanup operation manner. If a data splitting operation is performed, the data concatenation operation is performed. To be specific, bytes in a same position are scattered, and new floating-point data or new integer data is obtained through concatenation based on a length of original data (it is assumed that database data is floating-point/integer data). If a data compression operation is performed, eliminated data 0 is supplemented based on a length of original data.

1104: Predict associated data based on a recorded row/column data association record and according to a data prediction and transformation method, and perform a reverse transformation operation, to obtain row/column data.

The associated data is predicted based on the recorded row/column data association record and according to the data prediction and transformation method, and the reverse transformation operation is performed, to obtain the row/column data. If only first-layer semantics, that is, recognizing an association between row data or column data, is used for data prediction and transformation, concatenated data is scattered, and then scattered data is restored to original row/column data. If second-layer semantics, that is, recognizing a transformation relationship between row data or column data, is used for data prediction and transformation, associated row data or associated column data is transformed based on a prediction result. In other words, a reverse transformation operation is performed. For example, during compression, a difference between actual data and predicted data is used as transformed data, and during decompression, original data is restored by using a sum of the transformed data and the predicted data.

1105: Integrate the row/column data based on a format of a database.

The row/column data is re-integrated based on the format of the database, the row/column data obtained in operation 1104, and a position of the row/column data, to restore re-integrated data to original database data.

Figure 12:
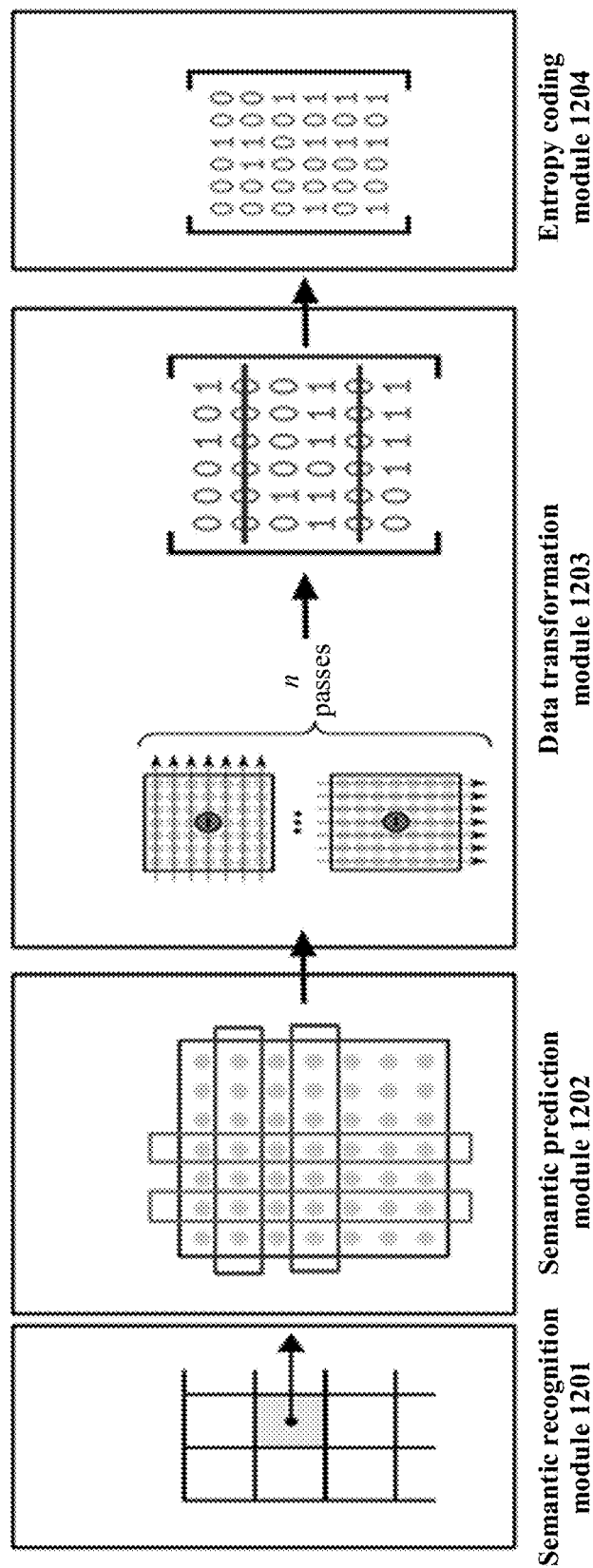
FIG. 12 is a diagram of a structure of a system for implementing a database data compression method according to an embodiment of this application.

It should be further noted that, according to the database data compression method described in the embodiment corresponding to FIG. 6 or FIG. 10, an embodiment of this application may further provide a structure of a system for implementing the database data compression method. For details, refer to FIG. 12. FIG. 12 is a diagram of a structure of a system for implementing the database data compression method according to an embodiment of this application. The system may include a semantic recognition module 1201, a semantic prediction module 1202, a data transformation module 1203, and an entropy coding compression module 1204. The semantic recognition module 1201 is configured to: recognize a type of a database, and obtain row/column data through parsing based on a format of the database. The semantic prediction module 1202 is configured to recognize semantics of database data according to a clustering algorithm or a deep learning algorithm. In general, two layers of semantics are recognized. The first-layer semantics is to recognize an association between data in different rows or data in different columns. The second-layer semantics is to recognize a transformation rule between data in associated rows/columns, for example, a floating-point transformation coefficient between two columns of data. The data transformation module 1203 is configured to perform corresponding transformation on data according to a prediction rule (if only the first-layer semantics is used, only data concatenation is required, and if the data is concatenated together, an existence probability of a same symbol is higher, so that a compression ratio can be improved), for example, data concatenation and a data difference. For multi-byte data such as a floating-point number obtained through prediction and transformation, data may be further cleaned. For example, most-significant data 0 is eliminated. The entropy coding module 1204 is configured to compress a character based on statistical probability distribution of all the characters and a current character. A coding algorithm may be arithmetic coding or ANS. Probability statistics may be static global statistics, or may be dynamic statistics. This is not specifically limited in this application.

Figure 13:
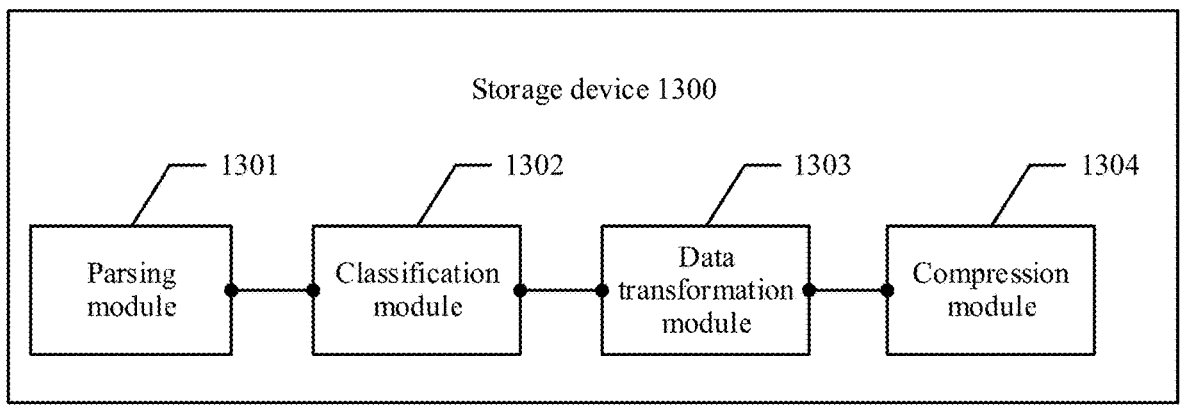
FIG. 13 is a schematic diagram of a structure of a storage device according to an embodiment of this application.

In addition, based on the embodiments corresponding to FIG. 6 to FIG. 10, to better implement the foregoing solutions in embodiments of this application, the following further provides related devices configured to implement the foregoing solutions. For details, refer to FIG. 13. FIG. 13 is a schematic diagram of a structure of a storage device according to an embodiment of this application. The storage device may specifically include a parsing module 1301, a classification module 1302, a data transformation module 1303, and a compression module 1304. The parsing module 1301 is configured to parse a first data block to obtain m pieces of first data, where the first data is row data or column data, the first data block is obtained based on obtained database data, and m>1. The classification module 1302 is configured to classify the m pieces of first data to obtain n classification categories, where each classification category includes at least one piece of first data, and n≥1. It should be noted that an objective of classifying the m pieces of first data by the classification module 1302 is to recognize an association between data in different rows or data in different columns. For example, some data may be extracted from each row or each column to constitute a feature of the row or the column, and then row data or column data is classified. Row data or column data in a same classification category can be considered as data with a large association. The classification process may also be referred to as a process of predicting semantics of the database data. First-layer semantics is predicted: recognizing an association between row data or column data. The data transformation module 1303 is configured to transform one or more pieces of the at least one piece of first data in a first classification category, to obtain target data, where the first classification category is one of the n classification categories. The compression module 1304 is configured to compress the target data to obtain compressed data.

In the foregoing embodiment of this application, for the database data, the storage device 1300 first parses the database data by using the parsing module 1301; further classifies data in different rows/columns by using the classification module 1302, where row/column data belonging to a same classification category is considered to be strongly associated with each other; and finally transforms and compresses the row data or the column data belonging to the same classification category respectively by using the data transformation module 1303 and the compression module 1304. Because a proportion of a duplicate character in the row data or column data belonging to the same classification category is increased, a compression ratio of the database data can be improved.

In a possible design, there may be a plurality of manners of performing a transformation operation on the one or more pieces of the at least one piece of first data in the first classification category. Specifically, the data transformation module 1303 may be configured to: concatenate a plurality of pieces of the at least one piece of first data in the first classification category to obtain concatenated data, and use the concatenated data as the target data. That is, when there are a plurality of pieces of first data in the first classification category, the transformation operation performed by the data transformation module 1303 is to directly concatenate all the first data in the first classification category, and the concatenated data constitutes the to-be-compressed target data. Because to-be-concatenated data is associated with each other (in other words, all to-be-concatenated data belongs to a same classification category), the concatenated data may have a large amount of redundancy, which is easy to be recognized by a compression algorithm.

In the foregoing embodiment of this application, a reason for the data transformation module 1303 to concatenate the first data in the first classification category to constitute the target data is as follows: Because first data in a same classification category belongs to the same classification category (that is, a large association, and a larger association indicates more similar data), it indicates that proportions and/or a quantity of duplicate characters included in different first data in the same classification category are increased compared with those before classification. In this way, a compression ratio of the database data can also be improved based on only a first-layer semantic prediction result of the database data (that is, recognizing the association between row data or column data).

In a possible design, in another manner of performing a transformation operation on the one or more pieces of the at least one piece of first data in the first classification category, the data transformation module 1303 may be further configured to: select, as reference data, at least one piece of first data from a plurality of pieces of the at least one piece of first data in the first classification category; then predict, based on the selected at least one piece of reference data, at least one piece of other first data (which may be referred to as non-reference data) that is in the first classification category and that is not the reference data, to obtain at least one piece of predicted data, where one piece of non-reference data corresponds to one piece of predicted data; and finally obtain the final target data based on the at least one piece of non-reference data and the obtained at least one piece of predicted data. In this embodiment of this application, a process of recognizing a transformation relationship between the first data in the first classification category may be referred to as another process of predicting semantics of the database data. Second-layer semantics is predicted: recognizing a transformation relationship between row data or column data.

In the foregoing embodiment of this application, the data transformation module 1303 further predicts the second-layer semantics (that is, recognizing the transformation relationship between row data or column data) based on the predicted first-layer semantics (that is, recognizing the association between row data or column data), to obtain the predicted data. Then, the data transformation module 1303 performs data transformation on original data based on the predicted data, so that complex original data is transformed into simplified data with a high duplicate rate. This further improves a compression ratio of subsequent data compression.

In a possible design, the data transformation module 1303 is further specifically configured to: first predict an association relationship between the reference data and the at least one piece of non-reference data in the first classification category; and then predict the at least one piece of non-reference data based on the reference data and the association relationship, to obtain the at least one piece of predicted data. In other words, a transformation relationship between reference data and non-reference data is reflected by the predicted association relationship, and the predicted data corresponding to the non-reference data may be obtained based on the association relationship and the reference data.

In the foregoing embodiment of this application, a manner for the data transformation module 1303 to first predict the specific association relationship, and then obtain the predicted data based on the association relationship is specifically described. The manner is feasible.

In a possible design, the data transformation module 1303 is further specifically configured to predict the association relationship between the reference data and the at least one piece of non-reference data in the first classification category by using a linear regression equation. In some other embodiments of this application, the association relationship between the reference data and the non-reference data in the first classification category may alternatively be predicted by using a non-linear model (for example, a quadratic model). This is not specifically limited in this application.

In the foregoing embodiment of this application, that the data transformation module 1303 may predict the association relationship between the reference data and the non-reference data in the first classification category in various manners is specifically described. The manners are flexible.

In a possible design, the data transformation module 1303 is further specifically configured to: after the at least one piece of predicted data corresponding to the at least one piece of non-reference data is obtained, further determine at least one piece of transformation data based on a difference between the at least one piece of non-reference data and the corresponding at least one piece of predicted data. For example, the difference between the at least one piece of non-reference data and the corresponding at least one piece of predicted data may be used as the at least one piece of transformation data, or a product of a preset coefficient and the difference between the at least one piece of non-reference data and the corresponding at least one piece of predicted data may be used as the at least one piece of transformation data. This is not specifically limited herein. One piece of transformation data corresponds to one piece of non-reference data. For example, it is assumed that there are three pieces of non-reference data (it is assumed that each piece of non-reference data is denoted as Y) in total in a specific classification category. After the foregoing transformation operation is performed, each piece of non-reference data corresponds to one piece of predicted data, and there are three pieces of predicted data in total (it is assumed that each piece of predicted data is denoted as Y'). In this case, Y"=Y—Y' or Y"=p×(Y—Y'). Herein, p is the preset coefficient, and Y" is the transformation data. Each piece of non-reference data has a corresponding transformation data. After the transformation data corresponding to each piece of non-reference data is obtained, the transformation data may be directly used as the target data, where one piece of transformation data corresponds to one piece of target data. If there are at least two pieces of transformation data, the at least two pieces of transformation data may alternatively be concatenated, to obtain the target data. This is not specifically limited in this application.

In the foregoing embodiment of this application, a manner for the data transformation module 1303 to obtain the target data based on the non-reference data and the corresponding predicted data is specifically described. There are various manners of determining the target data, and the manners are flexible and widely applicable.

In a possible design, the data transformation module 1303 may be further configured to: after the at least one piece of predicted data corresponding to the at least one piece of non-reference data is obtained, further determine at least one piece of transformation data based on a difference between the at least one piece of non-reference data and the corresponding at least one piece of predicted data. For example, the difference between the at least one piece of non-reference data and the corresponding at least one piece of predicted data may be used as the at least one piece of transformation data, or a product of a preset coefficient and the difference between the at least one piece of non-reference data and the corresponding at least one piece of predicted data may be used as the at least one piece of transformation data. This is not specifically limited herein. One piece of transformation data corresponds to one piece of non-reference data. Then, a redundant data cleanup operation, for example, operations such as data splitting and data compaction, is performed on the at least one piece of transformation data, to obtain cleaned transformation data. For example, for transformed database data of a numeric type like a floating point or an integer, a single piece of data may include four or eight bytes, and most-significant data may have a large amount of redundancy 0. Data splitting is mainly splitting performed on long-byte data by byte. Bytes in a same position (for example, each byte is a first byte) are continuously stored. Data compaction is mainly elimination of redundancy 0 in most-significant data. For example, if first two bytes of all data are 0, the two bytes are directly eliminated. In the operation, a data cleanup manner needs to be recorded. If a data splitting operation is performed, information such as a quantity of split bytes is recorded; or if a data compaction operation is performed, a length of the eliminated data 0 is recorded. After obtaining the cleaned transformation data, the storage device may directly use the cleaned transformation data as the target data, where one piece of cleaned transformation data corresponds to one piece of target data. If there are at least two pieces of cleaned transformation data, the storage device may alternatively concatenate the at least two pieces of cleaned transformation data to obtain the target data. This is not specifically limited in this application. It should also be noted that, in this embodiment of this application, a manner of concatenating the cleaned transformation data is similar to the foregoing manner of concatenating the first data belonging to the same classification category. For details, refer to the foregoing description. Details are not described herein again.

In the foregoing embodiment of this application, to further eliminate data redundancy, after obtaining the transformation data, the data transformation module 1303 may further perform the redundant data cleanup operation on the transformation data, for example, operations such as data splitting and data compaction, to obtain the cleaned transformation data. The cleaned transformation data has fewer characters and a character with a higher duplicate rate, so that a compression ratio of subsequent data compression is further improved.

In a possible design, the classification module 1302 is specifically configured to first select a preset quantity of characters from each of the m pieces of first data to construct m eigenvectors, where one eigenvector corresponds to one piece of first data. For example, it is assumed that the first data block includes 20 pieces of column data (namely, m=20, and it is assumed that the first data is column data), and each piece of column data includes 50 characters. In this case, the storage device may select the preset quantity of characters from each piece of column data to construct an eigenvector, to obtain 20 eigenvectors in total. It should be noted herein that the preset quantity x may be a preset determined value, or may be a preset proportion value (indicating a proportion of a character selected from the first data to total characters in the first data). A specific indication form of the preset quantity is not specifically limited in this application. In an example, it is assumed that the preset quantity x is a determined value, and x=4. In this case, four characters are selected from each piece of column data to construct a corresponding eigenvector. In another example, it is assumed that the preset quantity x is a proportion value, and x=10%. In this case, 10%×50=5 characters are selected from each piece of column data to construct a corresponding eigenvector. Then, a clustering operation is performed on the m eigenvectors according to the clustering algorithm, to obtain n clusters. The obtained n clusters are obtained based on the m eigenvectors, and each eigenvector is in a one-to-one correspondence with the first data. In this way, a classification category to which each piece of first data belongs may be finally determined based on the n clusters, to obtain the n classification categories accordingly.

In the foregoing embodiment of this application, a manner for the classification module 1302 to classify the m pieces of first data according to the clustering algorithm is specifically described. The manner is feasible.

In a possible design, the classification module 1302 is specifically configured to: first input the m pieces of first data into a neural network (for example, a CNN), and then output a classification category of each of the m pieces of first data by the neural network, to obtain the n classification categories, where the neural network is trained in advance by using a training set. Training data in the training set is the database data, and a weight matrix of the neural network is adjusted based on the database data used for training, to obtain a finally trained neural network. The trained neural network may be directly used to implement a process of classifying the m pieces of first data in this embodiment of this application.

In the foregoing embodiment of this application, a manner for the classification module 1302 to classify the m pieces of first data through the trained neural network is specifically described. The manner is optional.

In a possible design, that the first data block is obtained based on obtained database data includes: using some data in the database data as the first data block; or using the database data as the first data block.

In the foregoing embodiment of this application, that some data in the database data may be used as the first data block, or the entire database data may be directly used as the first data block is described. The embodiment is operable.

Figure 14:
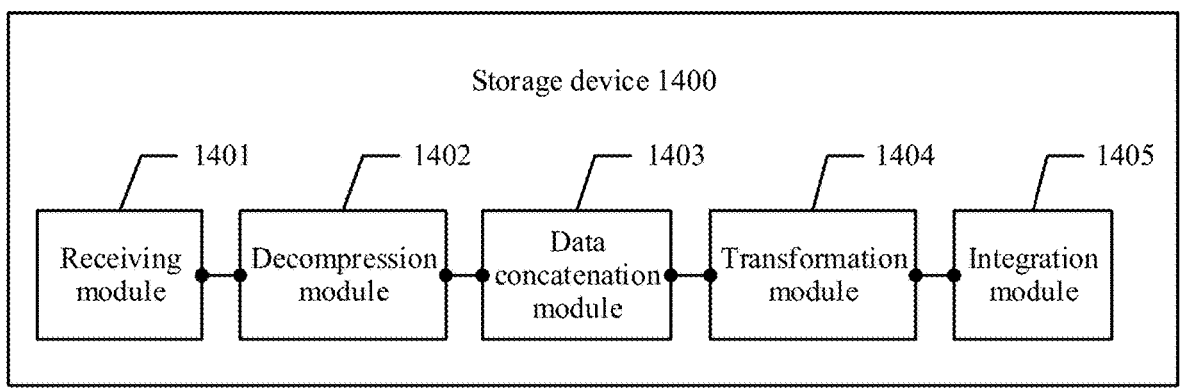
FIG. 14 is a schematic diagram of another structure of a storage device according to an embodiment of this application.

It should be further noted that, based on the database data decompression method described in the embodiment corresponding to FIG. 11, an embodiment of this application may further provide a structure of a storage device for implementing the database data decompression method. For details, refer to FIG. 14. FIG. 14 is a schematic diagram of a structure of a storage device according to an embodiment of this application. The storage device may specifically include: a receiving module 1401, a decompression module 1402, a data concatenation module 1403, a transformation module 1404, and an integration module 1405. The receiving module 1401 is configured to receive a data read request. The decompression module 1402 is configured to: extract compressed data based on the read request, and decompress the compressed data according to an entropy coding algorithm, to obtain decompressed data. The data concatenation module 1403 is configured to perform a reverse data concatenation or data extension operation on the decompressed data. The transformation module 1404 is configured to: predict associated data based on a recorded row/column data association record and according to a data prediction and transformation method, and perform a reverse transformation operation, to obtain row/column data. The integration module 1405 is configured to: integrate the row/column data based on a format of a database, and restore integrated row/column data to original database data.

Figure 15:
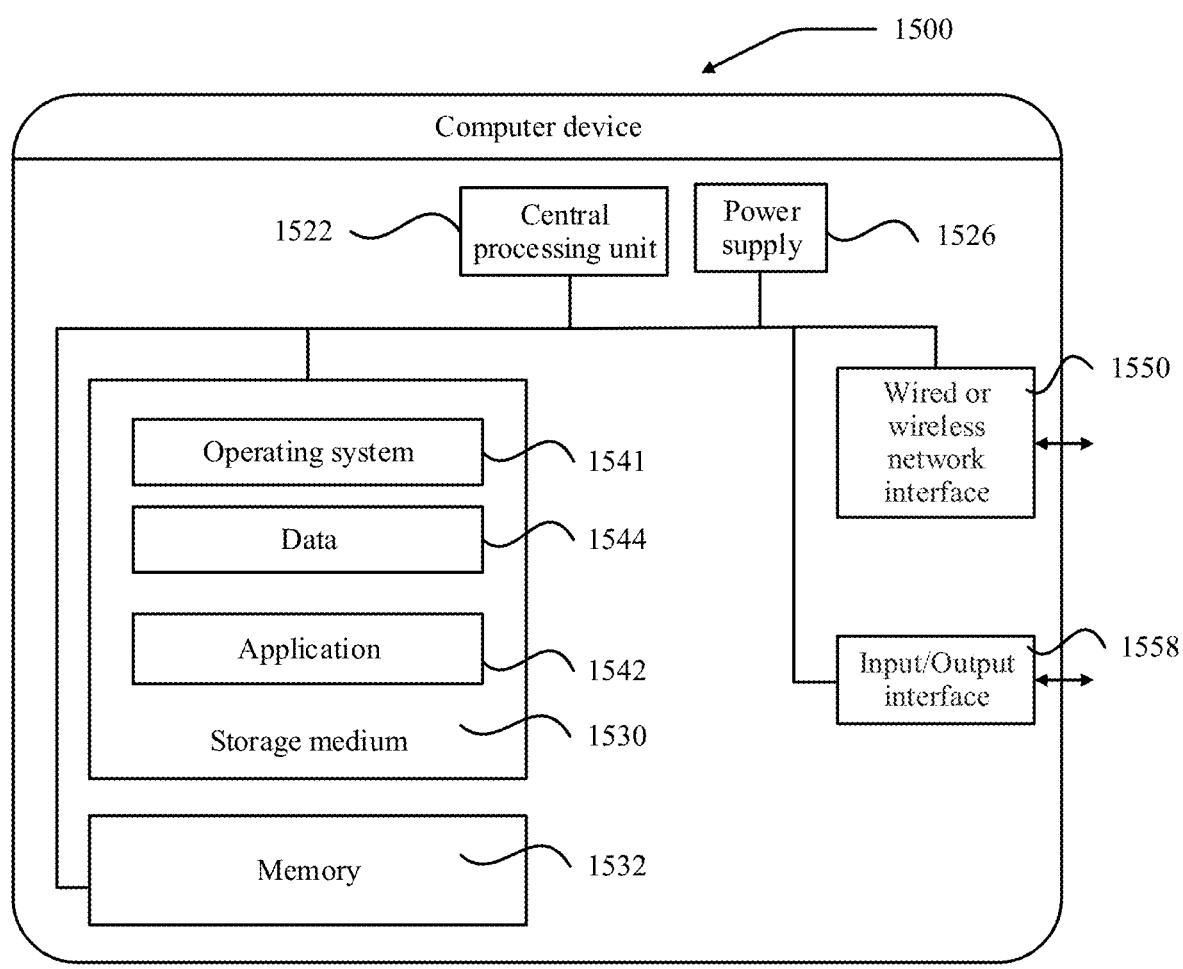
FIG. 15 is a schematic diagram of another structure of a storage device according to an embodiment of this application.

The following describes a computer device according to an embodiment of this application. Refer to FIG. 15. FIG. 15 is a schematic diagram of a structure of the computer device according to this embodiment of this application. The computer device 1500 may be deployed with the modules described in the embodiment corresponding to FIG. 13 or FIG. 14, to implement functions of the modules in the embodiment corresponding to FIG. 13 or FIG. 14. The computer device 1500 is implemented by one or more servers. The computer device 1500 may vary greatly due to different configurations or performance, and may include one or more central processing units (CPU) 1522 (for example, one or more central processing units), a memory 1532, and one or more storage media 1530 (for example, one or more mass storage devices) that store an application 1542 or data 1544. The memory 1532 and the storage medium 1530 may be transient storage or persistent storage. The application stored in the storage medium 1530 may include one or more modules (not shown in the figure), and each module may include a series of instruction operations for the computer device 1500. Further, the central processing unit 1522 may be configured to: communicate with the storage medium 1530, and execute, on the computer device 1500, the series of instruction operations in the storage medium 1530.

The computer device 1500 may further include one or more power supplies 1526, one or more wired or wireless network interfaces 1550, one or more input/output interfaces 1558, and/or one or more operating systems 1541, such as Windows Server™, Mac OS X™, Unix™, Linux™, and FreeBSD™.

In this embodiment of this application, the computer device 1500 may be configured to perform the operations in the embodiment corresponding to FIG. 6, FIG. 10, or FIG. 11. For example, the central processing unit 1522 may be configured to parse a first data block to obtain m pieces of first data, where the first data is row data or column data, and the first data block is obtained based on obtained database data. After the m pieces of first data are obtained, the m pieces of first data are further classified, to obtain n classification categories. For example, the m pieces of first data may be classified according to a target algorithm (for example, a machine learning algorithm or a deep learning algorithm), to obtain the n classification categories, where n≥1. Each classification category includes at least one piece of first data. After the n classification categories are obtained, one or more of the at least one piece of first data in each (namely, a first classification category) of the n classification categories are transformed, to obtain target data. Then, the target data is compressed. For example, the target data is compressed according to an entropy coding algorithm, for example, arithmetic coding or ANS, to obtain compressed data.

The central processing unit 1522 is configured to perform any operation in the embodiment corresponding to FIG. 6, FIG. 10, or FIG. 11. For specific content, refer to the description in the method embodiments described above in this application. Details are not described herein again.

An embodiment of this application further provides a computer-readable storage medium. The computer-readable storage medium stores a program for signal processing. When the program is run on a computer, the computer is enabled to perform the operations performed by the computer device in the description of the foregoing embodiments.

In addition, it should be noted that the described apparatus embodiments are merely examples. The units described as separate parts may or may not be physically separate, and parts displayed as units may or may not be physical units, may be located in one position, or may be distributed on a plurality of network units. Some or all the modules may be selected according to actual needs to achieve the objectives of the solutions of embodiments. In addition, in the accompanying drawings of the apparatus embodiments provided by this application, connection relationships between modules indicate that the modules have communication connections with each other, which may be specifically implemented as one or more communication buses or signal cables.

Based on the description of the foregoing embodiments, a person skilled in the art may clearly understand that this application may be implemented by software in addition to necessary universal hardware, or by dedicated hardware, including a dedicated integrated circuit, a dedicated CPU, a dedicated memory, a dedicated component, and the like. Generally, any functions that can be performed by a computer program can be easily implemented by using corresponding hardware. Moreover, a specific hardware structure used to achieve a same function may be in various forms, for example, in a form of an analog circuit, a digital circuit, or a dedicated circuit. However, as for this application, software program embodiment is a better embodiment in most cases. Based on such an understanding, the technical solutions of this application essentially or a part contributing to the conventional technology may be implemented in a form of a software product. The computer software product is stored in a readable storage medium, for example, a floppy disk, a USB flash drive, a removable hard disk, a read-only memory (ROM), a random access memory (RAM), a magnetic disk, or an optical disc of a computer, and includes several instructions for instructing a computer device (which may be a personal computer, a training device, a network device, or the like) to perform the methods described in embodiments of this application.

All or some of the foregoing embodiments may be implemented by using software, hardware, firmware, or any combination thereof. When software is used to implement embodiments, all or some of embodiments may be implemented in a form of a computer program product.

The computer program product includes one or more computer instructions. When the computer program instructions are loaded and executed on the computer, the procedure or functions according to embodiments of this application are all or partially generated. The computer may be a general-purpose computer, a dedicated computer, a computer network, or another programmable apparatus. The computer instructions may be stored in a computer-readable storage medium, or may be transmitted from a computer-readable storage medium to another computer-readable storage medium. For example, the computer instructions may be transmitted from a website, computer, training device, or data center to another website, computer, training device, or data center in a wired (for example, a coaxial cable, an optical fiber, or a digital subscriber line) or wireless (for example, infrared, radio, or microwave) manner. The computer-readable storage medium may be any usable medium that can be stored by a computer, or a data storage device, like a training device or a data center, integrating one or more usable media. The usable medium may be a magnetic medium (for example, a floppy disk, a hard disk, or a magnetic tape), an optical medium (for example, a high-density digital video disc (DVD)), a semiconductor medium (for example, a solid-state drive (SSD)), or the like.

What is claimed is:

1. A database data compression method, comprising:
   parsing, by a processor of a data storage device, a first data block to obtain m pieces of first data, wherein the first data is row data or column data, the first data block is obtained based on obtained database data, and m is an integer greater than 1;
   classifying, by a machine learning classifier executed by the processor of the data storage device, the m pieces of first data to obtain n classification categories, wherein each classification category comprises at least one piece of first data, n is an integer greater than or equal to 1, and any two or more pieces of first data classified into a same classification category are predicted to have an association that indicates similar data content;
   transforming, by the processor of the data storage device, one or more pieces of at least one piece of first data in a first classification category to obtain target data comprising concatenating a plurality of pieces of the at least one piece of first data in the first classification category to obtain concatenated data and using the concatenated data as the target data, wherein the first classification category is one of the n classification categories;
   compressing, by the processor of the data storage device, the target data to obtain compressed data; and
   storing, by the processor of the data storage device, the compressed data in a storage medium of the data storage device.

2. The method according to claim 1, wherein the transforming one or more pieces of at least one piece of first data in a first classification category to obtain target data comprises:
   selecting, as reference data, at least one piece of first data from a plurality of pieces of the at least one piece of first data in the first classification category;
   predicting at least one piece of non-reference data in the first classification category based on the reference data, to obtain at least one piece of predicted data, wherein the at least one piece of non-reference data is at least one piece of first data that is in the first classification category and that is not the reference data; and
   obtaining the target data based on the at least one piece of non-reference data and the at least one piece of predicted data.

3. The method according to claim 2, wherein the predicting at least one piece of non-reference data in the first classification category based on the reference data, to obtain at least one piece of predicted data comprises:
   predicting an association relationship between the reference data and the at least one piece of non-reference data in the first classification category; and
   predicting the at least one piece of non-reference data based on the reference data and the association relationship, to obtain the at least one piece of predicted data.

4. The method according to claim 3, wherein the predicting an association relationship between the reference data and the at least one piece of non-reference data in the first classification category comprises:
   predicting the association relationship between the reference data and the at least one piece of non-reference data in the first classification category by using a linear regression equation.

5. The method according to claim 2, wherein the obtaining the target data based on the at least one piece of non-reference data and the at least one piece of predicted data comprises:
   determining at least one piece of transformation data based on a difference between the at least one piece of non-reference data and the at least one piece of predicted data; and
   determining the target data based on the at least one piece of transformation data.

6. The method according to claim 2, wherein the obtaining the target data based on the at least one piece of non-reference data and the at least one piece of predicted data comprises:
   determining at least one piece of transformation data based on a difference between the at least one piece of non-reference data and the at least one piece of predicted data;
   performing a redundant data cleanup operation on the at least one piece of transformation data to obtain at least one piece of cleaned transformation data; and
   determining the target data based on the at least one piece of cleaned transformation data.

7. The method according to claim 1, wherein the classifying the m pieces of first data to obtain n classification categories comprises:
  selecting a preset quantity of characters from each of the m pieces of first data to construct m eigenvectors, wherein one eigenvector corresponds to one piece of first data;
  performing a clustering operation on the m eigenvectors according to a clustering algorithm, to obtain n clusters; and
  obtaining the n classification categories based on the n clusters.

8. The method according to claim 1, wherein the classifying the m pieces of first data to obtain n classification categories comprises:
  inputting the m pieces of first data into a neural network, and outputting a classification category of each of the m pieces of first data, to obtain the n classification categories, wherein the neural network is trained in advance by using a training set.

9. The method according to claim 1, wherein that the first data block is obtained based on obtained database data comprises:
  using a subset of data in the database data as the first data block, or using the database data as the first data block.

10. A storage device, comprising:
  a memory; and
  at least one processor coupled with the memory, the at least one processor configured to:
    parse a first data block to obtain m pieces of first data, wherein the first data is row data or column data, the first data block is obtained based on obtained database data, and m is an integer greater than 1;
    classify, by a machine learning classifier executed by the at least one processor, the m pieces of first data to obtain n classification categories, wherein each classification category comprises at least one piece of first data, n is an integer greater than or equal to 1, and any two or more pieces of first data classified into a same classification category are predicted to have an association that indicates similar data content;
    transform one or more pieces of at least one piece of first data in a first classification category to obtain target data comprising the at least one processor to concatenate a plurality of pieces of the at least one piece of first data in the first classification category to obtain concatenated data and use the concatenated data as the target data, wherein the first classification category is one of the n classification categories;
    compress the target data to obtain compressed data; and
    store the compressed data in the memory.

11. The device according to claim 10, wherein the at least one processor configured to transform one or more pieces of at least one piece of first data in a first classification category to obtain target data, further comprises the at least one processor configured to:
  select, as reference data, at least one piece of first data from a plurality of pieces of the at least one piece of first data in the first classification category;
  predict at least one piece of non-reference data in the first classification category based on the reference data, to obtain at least one piece of predicted data, wherein the at least one piece of non-reference data is at least one piece of first data that is in the first classification category and that is not the reference data; and
  obtain the target data based on the at least one piece of non-reference data and the at least one piece of predicted data.

12. The device according to claim 11, wherein the at least one processor configured to predict at least one piece of non-reference data in the first classification category based on the reference data, to obtain at least one piece of predicted data, further comprises the at least one processor configured to:
  predict an association relationship between the reference data and the at least one piece of non-reference data in the first classification category; and
  predict the at least one piece of non-reference data based on the reference data and the association relationship, to obtain the at least one piece of predicted data.

13. The device according to claim 12, wherein the at least one processor configured to predict an association relationship between the reference data and the at least one piece of non-reference data in the first classification category, further comprises the at least one processor configured to:
  predict the association relationship between the reference data and the at least one piece of non-reference data in the first classification category by using a linear regression equation.

14. The device according to claim 11, wherein the at least one processor configured to obtain the target data based on the at least one piece of non-reference data and the at least one piece of predicted data, further comprises the at least one processor configured to:
  determine at least one piece of transformation data based on a difference between the at least one piece of non-reference data and the at least one piece of predicted data; and
  determine the target data based on the at least one piece of transformation data.

15. The device according to claim 11, wherein the at least one processor configured to obtain the target data based on the at least one piece of non-reference data and the at least one piece of predicted data, further comprises the at least one processor configured to:
  determine at least one piece of transformation data based on a difference between the at least one piece of non-reference data and the at least one piece of predicted data;
  perform a redundant data cleanup operation on the at least one piece of transformation data to obtain at least one piece of cleaned transformation data; and
  determine the target data based on the at least one piece of cleaned transformation data.

16. The device according to claim 10, wherein the at least one processor configured to classify the m pieces of first data to obtain n classification categories, further comprises the at least one processor configured to:
  select a preset quantity of characters from each of the m pieces of first data to construct m eigenvectors, wherein one eigenvector corresponds to one piece of first data;
  perform a clustering operation on the m eigenvectors according to a clustering algorithm, to obtain n clusters; and
  obtain the n classification categories based on the n clusters.

17. The device according to claim 10, wherein the at least one processor configured to classify the m pieces of first data to obtain n classification categories, further comprises the at least one processor configured to:
  input the m pieces of first data into a neural network, and output a classification category of each of the m pieces of first data, to obtain the n classification categories, wherein the neural network is trained in advance by using a training set.

18. The device according to claim 10, wherein that the first data block is obtained based on obtained database data by the at least one processor, further comprises the at least one processor configured to:
use a subset of data in the database data as the first data block, or use the database data as the first data block.

* * * * *